United States Patent
Ito et al.

(10) Patent No.: US 7,763,553 B2
(45) Date of Patent: Jul. 27, 2010

(54) MANUFACTURING METHOD OF SEMICONDUCTOR DEVICE SUBJECTED TO HEAT TREATMENT BY USE OF OPTICAL HEATING APPARATUS

(75) Inventors: Takayuki Ito, Kawasaki (JP); Kyoichi Suguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 151 days.

(21) Appl. No.: 12/025,916

(22) Filed: Feb. 5, 2008

(65) Prior Publication Data

US 2008/0214020 A1    Sep. 4, 2008

(30) Foreign Application Priority Data

Feb. 6, 2007    (JP) .............................. 2007-027116

(51) Int. Cl.
*H01L 21/00* (2006.01)
(52) U.S. Cl. ................. 438/795; 257/335; 219/390; 219/497; 438/149; 438/527
(58) Field of Classification Search .............. None
See application file for complete search history.

(56) References Cited

U.S. PATENT DOCUMENTS

| | | | |
|---|---|---|---|
| 6,951,996 B2 | 10/2005 | Timans et al. | |
| 7,122,448 B2 | 10/2006 | Ito et al. | |
| 2003/0081945 A1* | 5/2003 | Kusuda | 392/416 |
| 2003/0193066 A1* | 10/2003 | Ito et al. | 257/335 |
| 2004/0149715 A1* | 8/2004 | Timans et al. | 219/390 |
| 2005/0112854 A1* | 5/2005 | Ito et al. | 438/527 |
| 2005/0227463 A1* | 10/2005 | Ito et al. | 438/527 |
| 2005/0236395 A1* | 10/2005 | Timans et al. | 219/497 |
| 2005/0272228 A1* | 12/2005 | Ito et al. | 438/487 |
| 2006/0216875 A1* | 9/2006 | Ito et al. | 438/149 |
| 2006/0292759 A1* | 12/2006 | Ito | 438/149 |

FOREIGN PATENT DOCUMENTS

| | | |
|---|---|---|
| JP | 62-44847 | 9/1987 |
| JP | 2-5295 | 2/1990 |
| JP | 2003-133250 | 5/2003 |

* cited by examiner

*Primary Examiner*—Ha Tran T Nguyen
*Assistant Examiner*—Shantanu C Pathak
(74) *Attorney, Agent, or Firm*—Finnegan, Henderson, Farabow, Garrett & Dunner, L.L.P.

(57) ABSTRACT

An auxiliary heating process is performed to set the temperature of the outer peripheral portion of a semiconductor substrate higher than that of the central portion thereof by use of an auxiliary heating source which supplementally heats a region of an area smaller than the area of the main surface of the semiconductor substrate from the rear surface of the main surface thereof, pulse-like flash lamp light or laser light is applied in the auxiliary heated state and the heat treatment is performed by use of the applied energy. The flash lamp light is applied to the main surface of the semiconductor substrate in a pulse form of 0.1 ms to 100 ms.

16 Claims, 16 Drawing Sheets

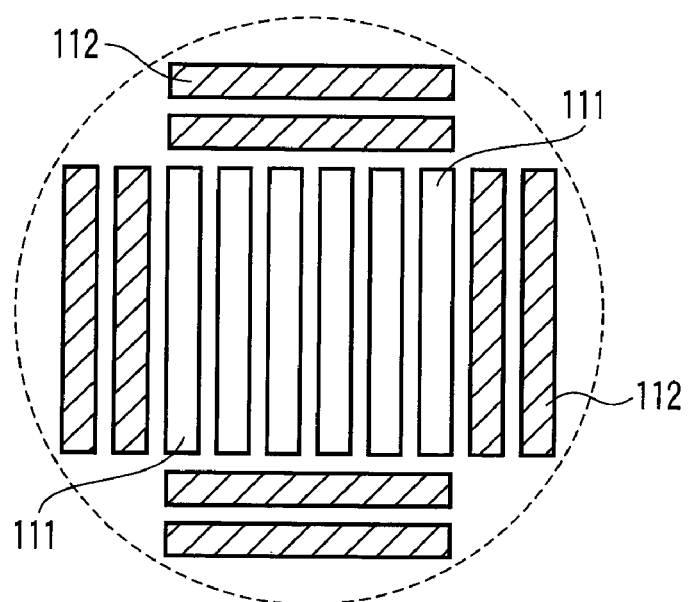
F I G. 11
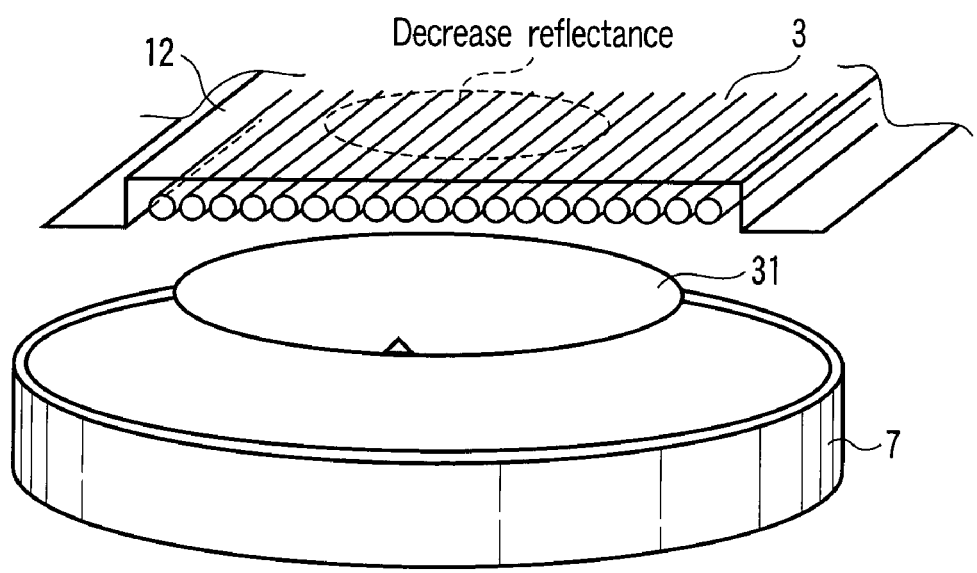
F I G. 12

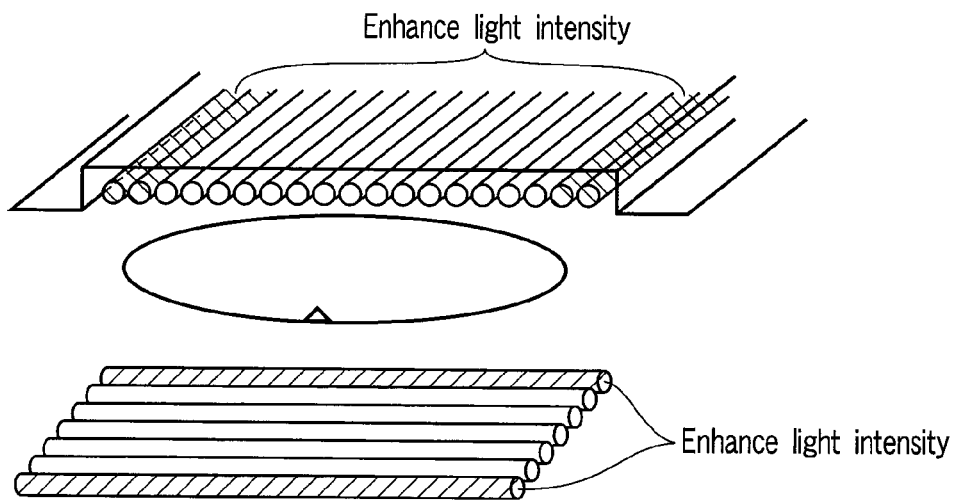
F I G. 13
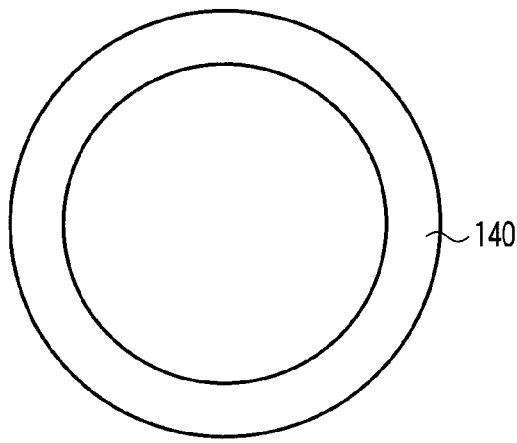
F I G. 14
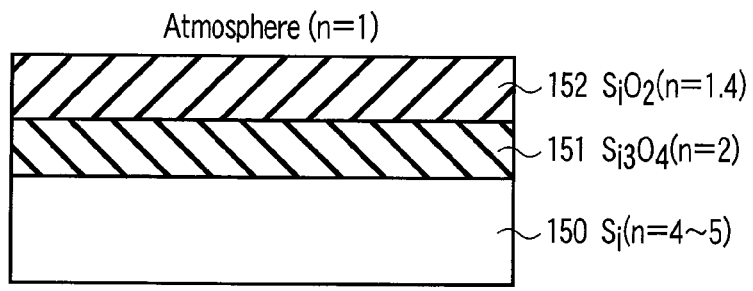
F I G. 15

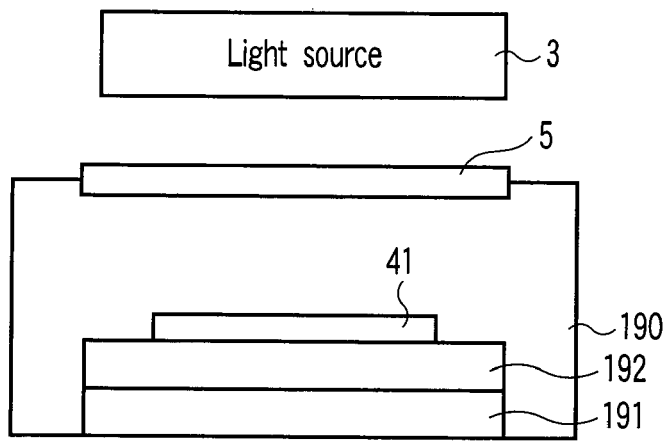
F I G. 19
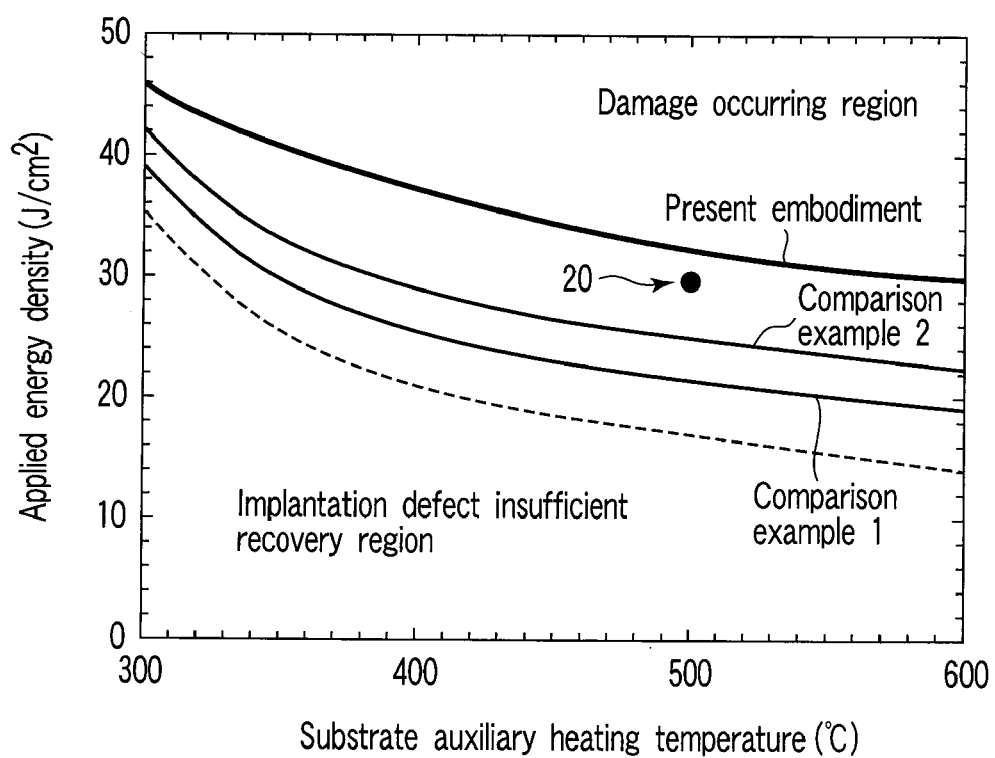
F I G. 20

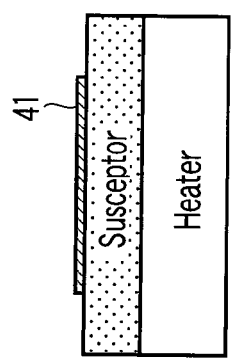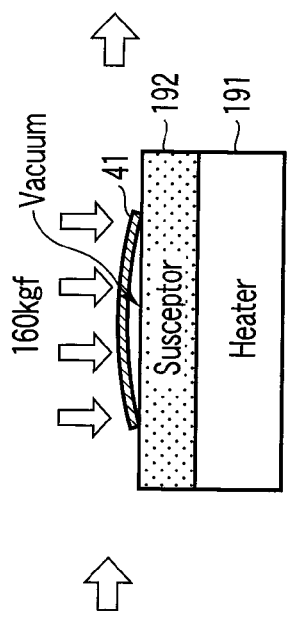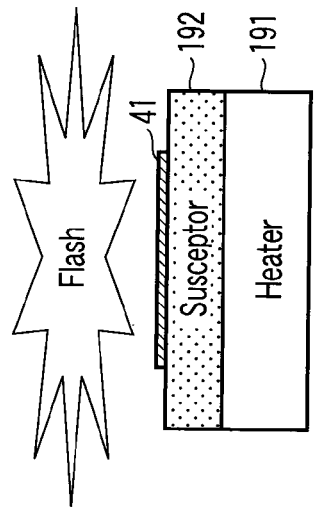
FIG. 21
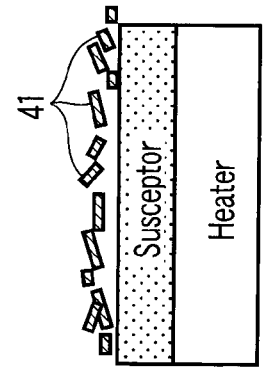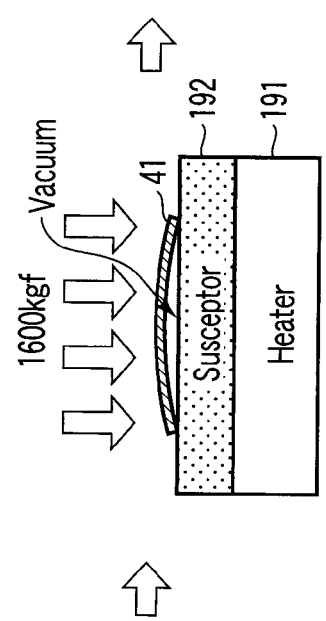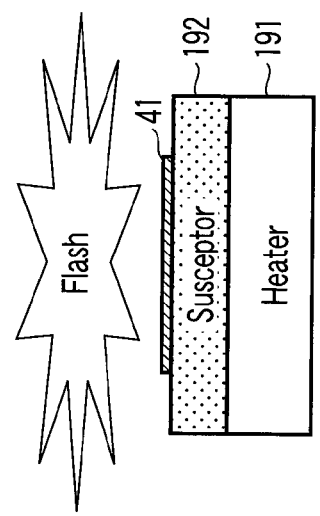
FIG. 22

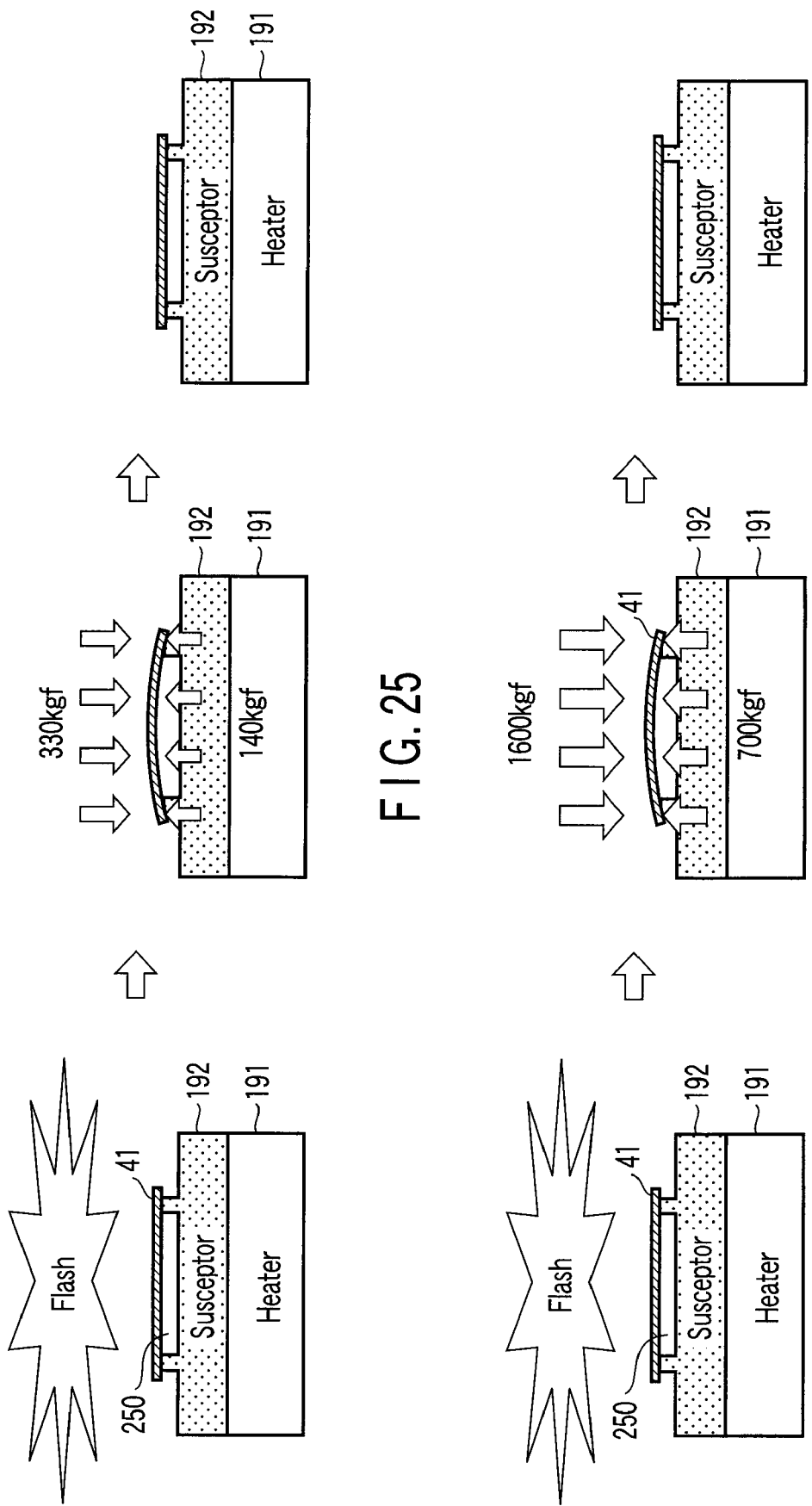

MANUFACTURING METHOD OF SEMICONDUCTOR DEVICE SUBJECTED TO HEAT TREATMENT BY USE OF OPTICAL HEATING APPARATUS

CROSS-REFERENCE TO RELATED APPLICATIONS

This application is based upon and claims the benefit of priority from prior Japanese Patent Application No. 2007-027116, filed Feb. 6, 2007, the entire contents of which are incorporated herein by reference.

BACKGROUND OF THE INVENTION

1. Field of the Invention

This invention relates to a heat treatment method in a manufacturing process of a semiconductor device, and more particularly to a manufacturing method of a semiconductor device subjected to the heat treatment process for diffusing impurity ions by use of an optical heating apparatus.

2. Description of the Related Art

Enhancement of the performance of LSIs is achieved by enhancing the integration density thereof, that is, miniaturizing the elements which configure the LSI. However, concomitant with the reduction in the element dimensions is an increase in the parasitic resistance and short channel effect. This therefore raises the importance of being able to form resistors of lower resistance and pn junctions that are shallower.

Shallow impurity diffusion regions can be formed by optimizing the ion-implantation process with a low acceleration energy, and then performing an annealing process. In order to lower the resistance of the diffusion layer of the impurity diffusion region, it is necessary to perform the annealing process, which activates the impurity, at a high temperature.

Boron (B), phosphorus (P) or arsenic (As) is widely used as the impurity to be ion-implanted. However, since the diffusion coefficient of the above impurity in silicon (Si) is large, impurity ions are inwardly diffused and outwardly diffused in a rapid thermal anneal (RTA) process using a halogen lamp, making it gradually more difficult to form shallow impurity diffusion layers.

The above inward diffusion and outward diffusion can be suppressed by lowering the anneal temperature. However, if the anneal temperature is lowered, the impurity activation rate is also significantly lowered. Since there is a limit in reducing the anneal time by use of a halogen lamp, it is difficult to form impurity diffusion layers having low resistances and shallow junctions (not deeper than 15 nm) in the RTA process using the conventional halogen lamp.

Therefore, recently, in order to cope with the above problem, an anneal method using a flash lamp having a rare gas such as xenon (Xe) sealed therein is studied as a method for instantaneously supplying the energy required for activation. Such a flash lamp can emit light with a pulse width of 100 ms or less, or a sub-millisecond width. Therefore, the impurity ions can be activated without substantially changing the distribution of impurity ions implanted into the wafer surface.

Since it is impossible to raise the temperature at which the impurity ions can be activated solely by use of the flash lamp, it is a common practice to pre-heat the substrate, by use of auxiliary heating means, before the process of heating the substrate by use of the flash lamp (for example, refer to Jpn. Pat. Appln. KOKAI Publication No. 2003-133250).

However, the conventional flash lamp anneal method has the following problem. That is, in order to fully activate the impurities by the above method, a large application energy of 20 J/cm$^2$ or more is required. When such a large amount of energy is applied with a pulse width of 100 ms or less, the temperature of the wafer surface may instantaneously rise to 1200° C. or more. Therefore, temperature differences occur between the center of the wafer and the outer peripheral portion, and between the front surface side and the rear surface side, which causes thermal stress within the wafer.

Particularly, since the total thermal stress increases with the size of the wafer, damage such as slips tends to be induced, which can lead to cracks in the worst case, which would lower the manufacturing yield. That is, in the present flash lamp anneal method, the process window is narrow and it is difficult to form shallow impurity diffusion regions without damaging the wafer.

In summary then, in the conventional means of raising the temperature of the outer peripheral portion of a wafer using a halogen lamp or the like over a duration of the ms order, no attention is paid to the thermal stress generated within the wafer, such as that generated in the flash lamp anneal method (for example, refer to Japanese Patent KOKOKU Publication No. S62-44847 and Japanese Patent KOKOKU Publication No. H02-5295).

BRIEF SUMMARY OF THE INVENTION

According to a first aspect of the present invention, there is provided a manufacturing method of a semiconductor device which comprises supplementally heating a semiconductor substrate from the rear surface of the main surface thereof to set the temperature of the outer peripheral portion of the semiconductor substrate higher than that of the central portion thereof, and applying pulse-like flash lamp light or laser light of 0.1 ms to 100 ms to the main surface of the semiconductor substrate to perform a heat treatment by use of the applied energy while the semiconductor substrate is being supplementally heated.

According to a second aspect of the present invention, there is provided a manufacturing method of a semiconductor device which comprises supplementally heating the rear surface of the main surface of a semiconductor substrate, and applying flash lamp light to the main surface of the semiconductor substrate to set the intensity of light applied to the outer peripheral portion of the semiconductor substrate higher than that applied to the central portion thereof by use of a plurality of flash lamps which apply pulse-like flash lamp lights of 0.1 ms to 100 ms and performing a heat treatment by use of the applied energy while the semiconductor substrate is being supplementally heated.

According to a third aspect of the present invention, there is provided a manufacturing method of a semiconductor device which comprises supplementally heating a semiconductor substrate having a film structure which is formed in a non-element region of the outer peripheral portion having a width corresponding to 1 to 5% of the diameter thereof on the main surface thereof and in which an absorption factor of pulse-like flash lamp light or laser light of 0.1 ms to 100 ms is set higher than that of the central portion by 1 to 10% from the rear surface of the main surface thereof, and applying the pulse-like flash lamp light or laser of 0.1 ms to 100 ms to the main surface of the semiconductor substrate to perform a heat treatment by use of the applied energy while the semiconductor substrate is being supplementally heated.

BRIEF DESCRIPTION OF THE SEVERAL VIEWS OF THE DRAWING

FIG. 11 is a plan view showing the configuration of a flash lamp in the heat treatment apparatus shown in FIG. 1 and showing the state of a light source as viewed from the semiconductor substrate, for illustrating a manufacturing method of a semiconductor device according to a second embodiment of this invention, FIG. 12 is a perspective view showing the configuration of another flash lamp used in the manufacturing method of the semiconductor device according to the second embodiment of this invention, FIG. 13 is a perspective view for illustrating the configuration of another heat treatment apparatus used in the manufacturing method of the semiconductor device according to the second embodiment of this invention, FIG. 14 is a plan view showing the configuration of a semiconductor substrate, for illustrating a manufacturing method of a semiconductor device according to a third embodiment of this invention, FIG. 15 is a cross sectional view showing the film structure of the outer peripheral portion of a semiconductor substrate, for illustrating the manufacturing method of the semiconductor device according to the third embodiment of this invention, FIG. 19 is a schematic diagram showing the configuration of a heat treatment apparatus used in the manufacturing method of the semiconductor device according to the fourth embodiment of this invention, FIG. 20 is a diagram showing the process condition region for the auxiliary heating temperature and application energy density in the case of the fourth embodiment of this invention and comparison examples 1 and 2, FIG. 21 is a schematic diagram showing a variation in the wafer state after application of light by the flash lamp in the fourth embodiment of this invention, FIG. 22 is a schematic diagram showing a variation in the wafer state after application of light by the flash lamp in the comparison example 1, FIG. 25 is a schematic diagram showing a variation in the wafer state after application of light by the flash lamp in a fifth embodiment of this invention, FIG. 26 is a schematic diagram showing a variation in the wafer state after application of light by the flash lamp under normal pressure when an air layer is present.

DETAILED DESCRIPTION OF THE INVENTION

First Embodiment

Figure 1:
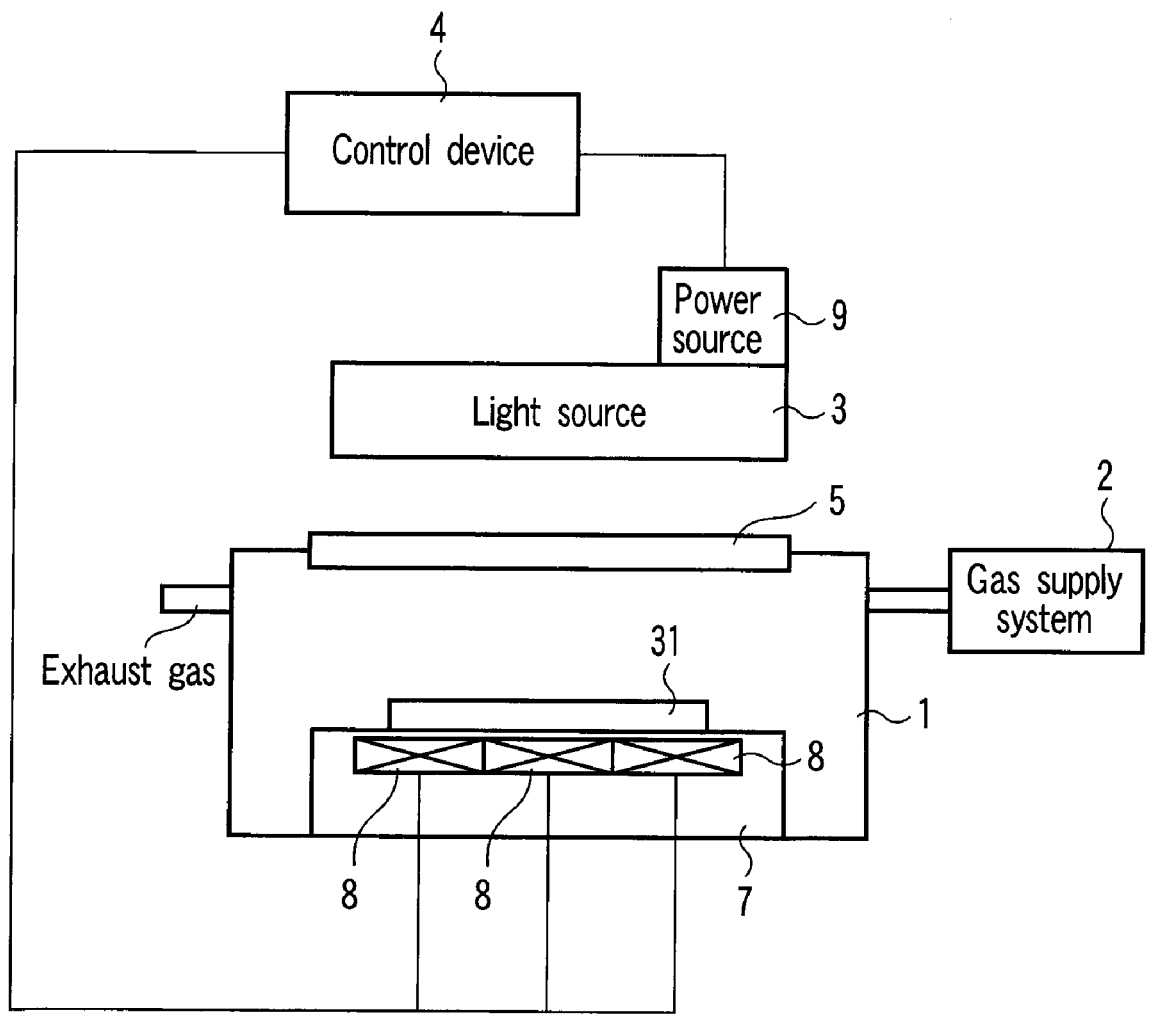
FIG. 1 is a schematic diagram showing the configuration of a heat treatment apparatus used in a manufacturing method of a semiconductor device according to a first embodiment of this invention.

The schematic configuration of a heat treatment apparatus 100 used in a manufacturing method of a semiconductor device according to a first embodiment of this invention is shown in FIG. 1. In the present embodiment, flash lamp light is applied to the main surface of a semiconductor substrate to perform the activation heat treatment in a state in which the auxiliary heating process is performed to set the temperature of an outer peripheral portion of the semiconductor substrate higher than that of the central portion thereof by use of a plurality of auxiliary heating sources which supplementally heat the rear surface of the semiconductor substrate.

The heat treatment apparatus 100 includes a processing chamber 1, a gas supply system 2 connected to the processing chamber 1, a light source 3 which applies flash lamp light from above the processing chamber 1, and a control device 4 which controls the supply of power of a power source 9 to the light source 3. A transparent window 5 is attached to the upper portion of the processing chamber 1 and the flash lamp light from the light source 3 provided above the transparent window is applied to a semiconductor substrate 31 provided in the processing chamber 1 through the transparent window 5 and heats the semiconductor substrate 31. A substrate stage 7 on which the semiconductor substrate 31 is placed is arranged on the bottom portion inside the processing chamber 1.

For example, the processing chamber 1 is formed of a metal such as stainless steel and the heat treatment for activating impurities doped into the semiconductor substrate 31 such as an Si wafer is performed therein. As a material of the substrate stage 7, aluminum nitride (AlN), silicon carbide (SiC), quartz or the like is used.

A plurality of auxiliary heating sources 8, each having an area smaller than the total area of the semiconductor substrate 31, are provided inside the substrate stage 7 to supplementally heat the semiconductor substrate 31. When flash lamp light from the light source 3 is applied to the front surface of the semiconductor substrate 31, the auxiliary heating sources 8 can be activated so as to change the temperature balance of an auxiliary heating area. Therefore, it becomes possible to anneal the surface of the semiconductor substrate 31 while the temperature is changed for each surface area. As the auxiliary heating source 8, an embedded metal heater having a Nichrome wire embedded therein, for example, an infrared heating lamp of a halogen lamp or the like is used. The control device 4 controls the temperature of the semiconductor substrate 31 by controlling the auxiliary heating sources 8.

The light source 3, such as a flash lamp, applies pulse-like light to the surface of the semiconductor substrate 31 via the transparent window 5 of synthesized quartz or the like and heats the same. The power source 9, such as a pulse power source, drives the light source 3 formed of the flash lamp or the like by use of an extremely short pulse width of 1 ms to 100 ms.

The power source 9 controls the pulse width and application energy of emission light from the light source 3 by use of the control device 4. For example, the application energy density of the light source 3 is set in the range of 15 J/cm$^2$ to 40 J/cm$^2$ and, more preferably, in the range of 20 J/cm$^2$ to 34 J/cm$^2$. The transparent window 5 plays a role of permitting emission light of the light source 3 which applies light to the semiconductor substrate 31 to pass therethrough and separating the processing chamber 1 from the light source 3 to maintain the air-tightness thereof.

Figure 2:
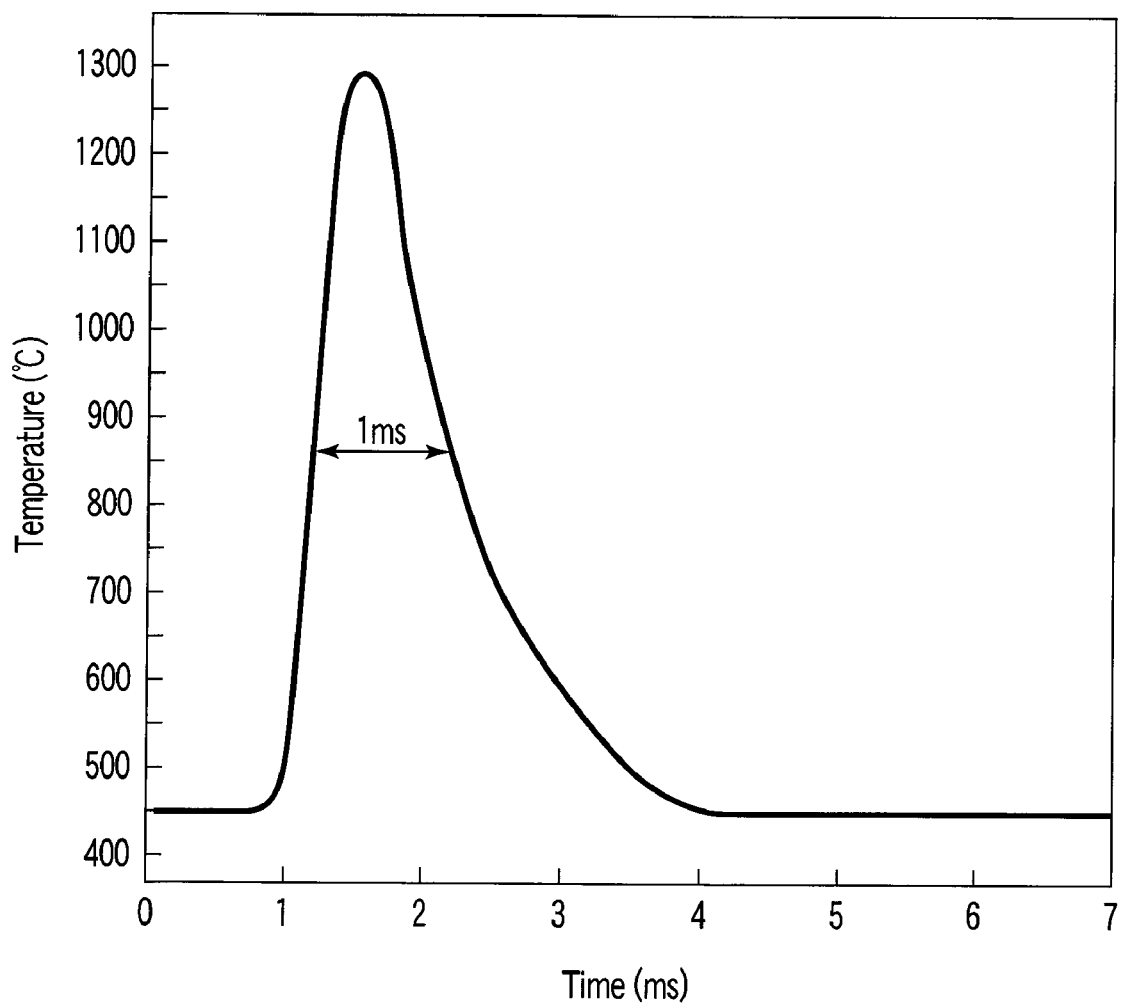
FIG. 2 is a diagram showing one example of the heating characteristic of a light source in the heat treatment apparatus shown in FIG. 1, FIGS. 3A to 3G are cross sectional views sequentially showing the manufacturing steps of a transistor with the CMOS configuration in the manufacturing method of the semiconductor device according to the first embodiment of this invention.

FIG. 2 shows the state of a variation in the temperature with time of heating by a Xe flash lamp used in the light source 3 indicated on the abscissa. For example, as shown in FIG. 2, a temperature profile in which the maximum attainable temperature is approximately 1300° C. and the half-value width is approximately 1 ms is obtained in the heating process by the Xe flash lamp. A rapid temperature rise and temperature drop can be realized in the Xe flash lamp in comparison with an infrared lamp, such as a halogen lamp, used in the conventional RTA. The surface temperature of the semiconductor substrate 31 is measured by use of a high-speed pyrometer.

Generally, as regards the flash lamp light, the temperature rise/drop time between 450° C. to 1300° C. is set in the range of 0.1 ms and 100 ms and, more preferably, in the range of 0.5 ms and 50 ms. Meanwhile, as regards the halogen lamp light, the temperature rise/drop time between 450° C. to 1300° C. is 10 seconds or more, such as 15 seconds. Further, it is necessary to set the temperature rise/drop time for a change of 100° C. in the range of 900° C. to 1300° C. to 2 to 3 seconds.

The manufacturing method of the semiconductor device according to the present embodiment is explained by taking the manufacturing process of a transistor 300 with the CMOS configuration used as an LSI element of the semiconductor device as an example.

Figure 3A:
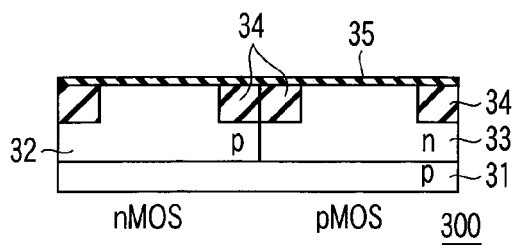

First, as shown in FIG. 3A, a p-well layer 32 is formed in an nMOS region of a p-type silicon (Si) substrate 31, and an n-well layer 33 is formed in a pMOS region. Element isolation regions 34 are formed around the periphery of the p-well layer 32 and the periphery of the n-well layer 33. Then, a silicon oxide film, used as a gate insulating film 35, is formed above the surface of the silicon substrate 31.

Figure 3B:
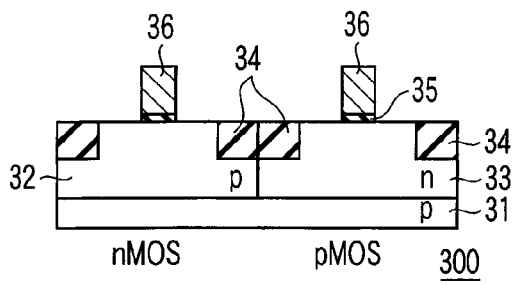

Next, as shown in FIG. 3B, a polysilicon film, used as a gate electrode 36, is formed on the gate insulating film 35. Then, the polysilicon film is selectively etched by a reactive ion etching (RIE) method to form the gate electrodes 36.

Figure 3C:
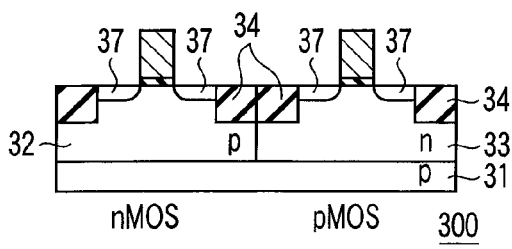

After this, as shown in FIG. 3C, a process of implanting ions into the active layers is performed with the gate electrodes 36 used as a mask. First, the pMOS region on the right side is masked with a photoresist film (not shown). Then, Group-V atoms such as As, which is used as an n-type impurity, are implanted into the exposed surface of the semiconductor substrate 31 of the nMOS region by ion-implantation. The ion-implantation conditions of As are set with an acceleration energy of 2 keV and dose amount of $1 \times 10^{15}$ cm$^{-2}$, for example.

Next, the photoresist film of the pMOS region is removed and the nMOS region is masked with a photoresist film (not shown). Then, Group-III atoms, such as B, used as a p-type impurity, are implanted into the exposed surface of the semiconductor substrate 31 of the pMOS region by ion-implantation. The ion-implantation conditions of B are set with an acceleration energy of 0.5 keV and dose amount of $1 \times 10^{15}$ cm$^{-2}$, for example. Then, the photoresist film of the nMOS region is removed.

As a result of the two ion-implantation processes, impurity implanted layers 37 with a depth of approximately 15 nm from the surface of the semiconductor substrate 31 are formed between both ends of the gate insulating films 35 and the element isolation regions 34, as shown in FIG. 3C.

After this, the semiconductor substrate 31 is placed on the substrate stage 7 of the heat treatment apparatus shown in FIG. 1. In the activation heat treatment which will be performed, the semiconductor substrate 31 is supplementally heated, starting from the rear surface side, to have a temperature difference between the central portion and the outer peripheral portion by causing the control device 4 to control the auxiliary heating sources 8 of the substrate stage 7.

More specifically, for example, the auxiliary heating process is performed to set the center of the semiconductor substrate 31 to 450° C. and set the outer peripheral portion to 460° C. to 580° C. The outer peripheral portion is a doughnut-shaped non-element region of the outer end portion having a width corresponding to 1 to 5% of the diameter of the semiconductor substrate 31. The outer peripheral portion is heated to a temperature higher than that of the central portion by approximately 10° C. to 130° C., which corresponds to 1 to 10% of approximately 1300° C., which is the maximum attainable temperature of the semiconductor substrate 31 by use of a flash lamp in the above auxiliary heating process.

In the auxiliary heating process in the activation heat treatment, generally, a semiconductor substrate 31 is supplementally heated to set the temperature of the central portion in the range of 300° C. to 700° C. and, more preferably, in the range of 400° C. to 600° C., for example. The auxiliary heating time is preferably set to approximately 10 seconds to 120 seconds, for example. The temperature and time of the auxiliary heating process are set so as not to induce damage to the semiconductor substrate 31.

If the auxiliary heating temperature is lower than 300° C., the maximum attainable temperature may be set to 900° C. or less at the time of heating by flash lamp light. Further, if the auxiliary heating temperature exceeds 700° C., the attainable temperature is set higher than 1400° C. in some cases. In either case, the following problem occurs.

The flash lamp light of the light source 3 is applied to the semiconductor substrate 31 from the front surface side thereof under the conditions of a pulse width of 1 ms and application energy of 30 J/cm$^2$, for example, while maintaining the auxiliary heating temperature state in which the temperature difference is set between the central portion and the outer peripheral portion and thus the activation heat treatment is performed.

In the activation heat treatment for ion-implanted impurity, if the temperature rise/drop time of the flash lamp light of the light source 3 is set to 0.1 ms or less, the maximum attainable temperature becomes lower than 900° C., meaning that the impurity implanted into the semiconductor substrate 31 becomes insufficient. Further, if the temperature rise/drop time exceeds 100 ms, the attainable temperature exceeds 1400° C. or the time in which it is exposed to a high temperature of 1000° C. or more becomes long. As a result, it becomes difficult to form shallow pn junctions near the surface of the semiconductor substrate 31 due to diffusion of the impurity implanted into the semiconductor substrate 31.

With the Xe flash lamp used in the light source 3 in the present embodiment, as shown in FIG. 2, the temperature rise/drop time between 450° C. and 1300° C. is approximately 3 ms. Further, for example, the temperature rise/drop time between 900° C. and 1300° C. is approximately 1 ms. According to the present embodiment, for example, the activation heat treatment of the impurity implanted into the semiconductor substrate 31 can be performed in an extremely short period of time at a high temperature of 900° C. or more. Therefore, the length of time of diffusion of the impurity by this activation heat treatment is suppressed to 5 nm or less, meaning that shallow pn junctions can be formed.

Figure 4:
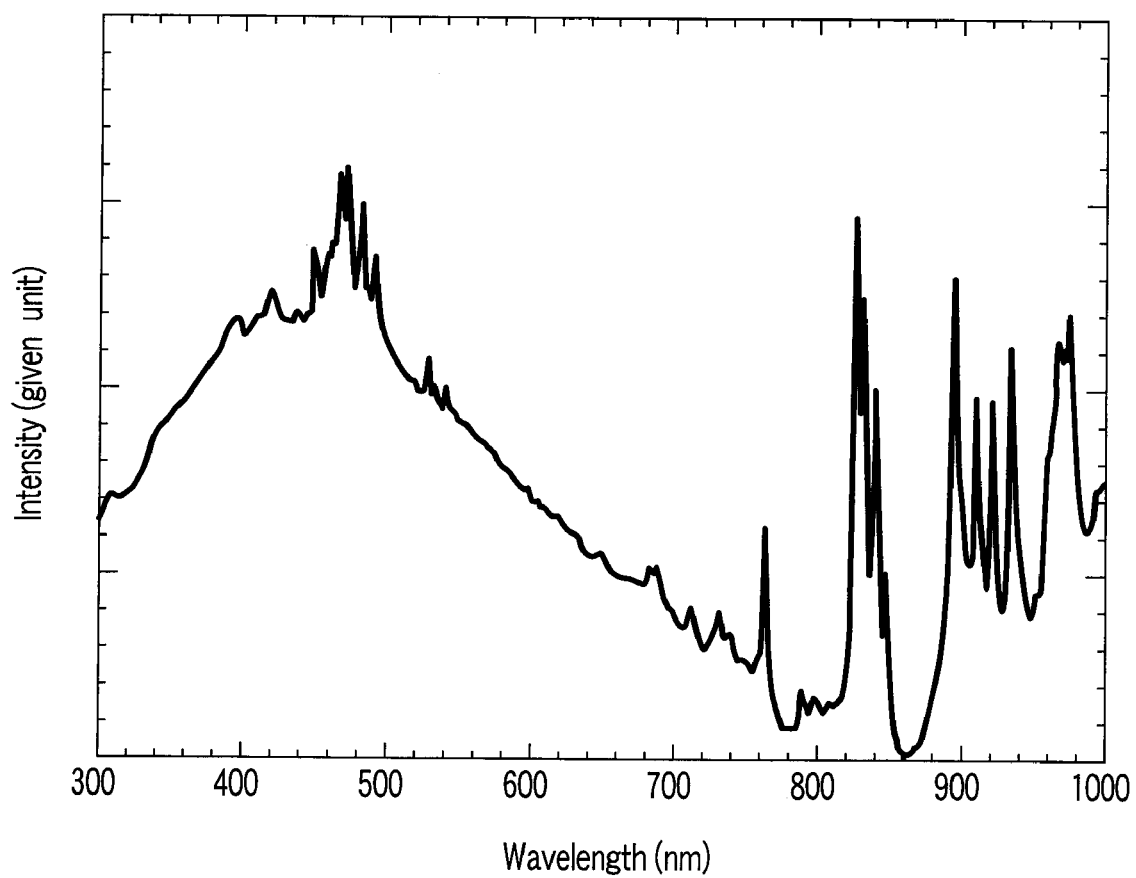
FIG. 4 is a diagram showing one example of the emission light spectrum of the light source in the heat treatment apparatus shown in FIG. 1.

However, in the temperature rise/drop cycle of such an extremely short period of time at a high temperature of 900° C. or more, crystal defects such as dislocations or slips caused by thermal stress tend to occur in the semiconductor substrate 31. Further, the light emission spectrum of the Xe flash lamp of the light source 3 is almost equal to that of white light and, as shown in FIG. 4, the main intensity peak wavelength is 400 nm to 500 nm. Light in the wavelength range containing the intensity peak of flash lamp light, for example, in the range of 1 μm or less, is absorbed in a region with a depth range of approximately 0.1 μm from the surface of the semiconductor substrate 31. Therefore, a rapid temperature rise occurs to a depth of several 10 μm from the surface of the semiconductor substrate 31. As a result, thermal stress increases within the semiconductor substrate 31 and damage such as dislocations or slips increasingly occur in the semiconductor substrate 31, which fatally damage the semiconductor substrate 31. Thus, in the extremely brief heating process using the light source 3, since the thermal stress occurring in the substrate is large, it becomes difficult to attain a stable cracking resistance of the semiconductor substrate 31.

Figure 5:
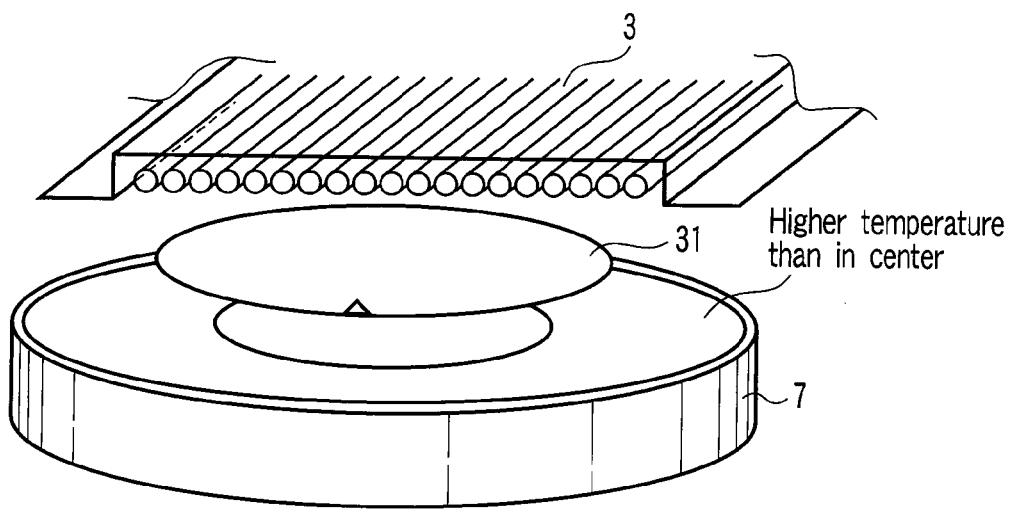
FIG. 5 is a perspective view for explaining an activation heat treatment method in the manufacturing method of the semiconductor device according to the first embodiment of this invention.

In the activation heat treatment of an ion-implanted impurity in the present embodiment, as shown in FIG. 5, the flash lamp 3 is lit and the ultra high-speed annealing process is performed while the auxiliary heating sources 8 (not shown in FIG. 5) in the substrate stage 7 are controlled to set the temperature of the outer peripheral portion of the semiconductor substrate 31 higher than that of the central portion thereof. In FIG. 5, the processing chamber 1 and transparent window 5 are omitted.

Figure 6:
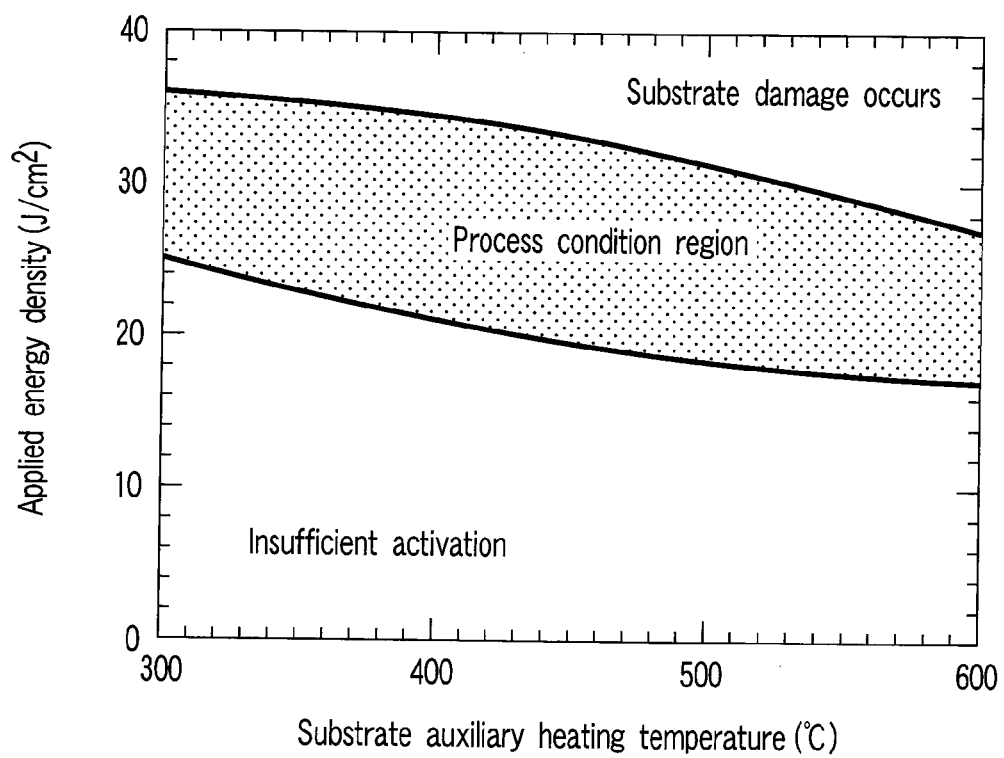
FIG. 6 is a diagram showing a process condition region in the heat treatment apparatus shown in FIG. 1.

As regards the conditions required for suppressing the occurrence of damage and attaining a desired activation rate, a heat treatment condition region with the application energy density of the flash lamp light depending on the auxiliary heating temperature of the central portion of the semiconductor substrate 31 is shown as a "process condition region" in FIG. 6.

That is, activation of an impurity becomes insufficient if the application energy density of the flash lamp light lies below the lower limit of the "process condition region" and a high-quality low-resistance layer free from ion-implantation defects cannot be formed. On the other hand, damage such as slips, dislocations and breakages occur in the semiconductor substrate 31 if the application energy density lies above the upper limit of the "process condition region".

In the present embodiment, as shown in FIG. 5, the semiconductor substrate 31 is previously supplementally heated so that the temperature of the outer peripheral portion of the semiconductor substrate 31 will become higher than that of the central portion thereof. Therefore, even if a plurality of flash lamps 3 arranged on the upper side of the substrate are set with the same temperature balance, it is expected that heat will not escape from the outer peripheral portion of the semiconductor substrate 31 and the temperature of the outer peripheral portion will become higher than that of the central portion.

Figure 7:
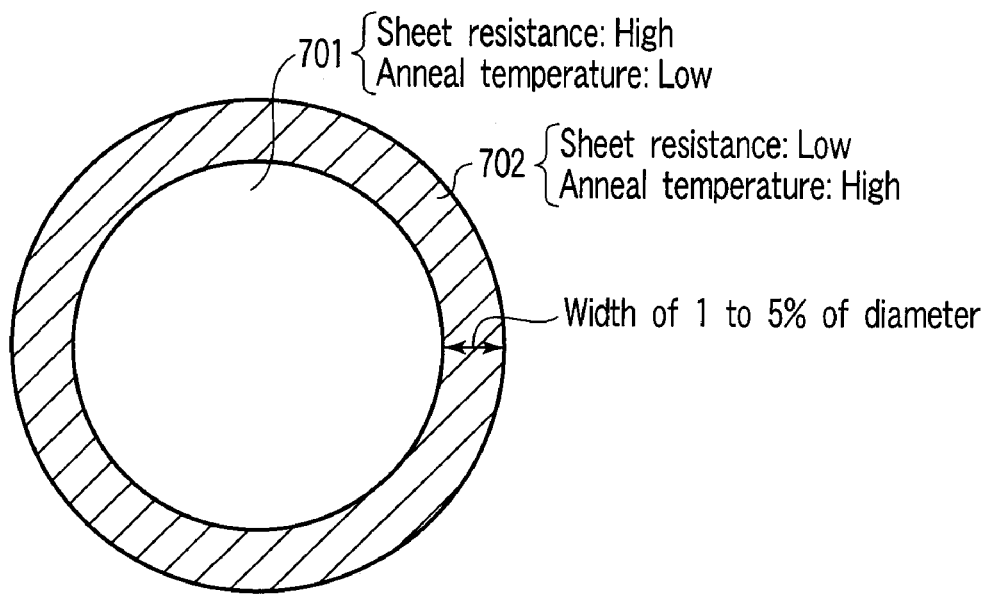
FIG. 7 is a plan view showing the in-plane sheet resistance distribution of a semiconductor substrate when the activation heat treatment is performed under the condition of the first embodiment.

The sheet resistance distribution of the semiconductor substrate when the annealing process is performed under the conditions of the present embodiment is shown in FIG. 7. As is clearly understood from FIG. 7, the sheet resistance is high in a central portion 701 of the wafer and the effective anneal temperature is low. However, it is suggested that the sheet resistance is low in the non-element region of an outer peripheral portion 702 having a width corresponding to 1 to 5% of the diameter of the substrate and the effective anneal temperature is high.

That is, from the viewpoint of stress, it is considered that compressive stress occurs in the outer peripheral portion of the semiconductor substrate, and that the substrate can be prevented from being broken since the temperature of the central portion is set low and the temperature of the outer peripheral portion is set high in the present embodiment. Thus, according to the present embodiment, as shown in FIG. 6, the process window (the tolerance range of the application energy density) in the ultra high-speed annealing process is enlarged, thus a stable and high-performance semiconductor device can be manufactured.

Figure 3D:
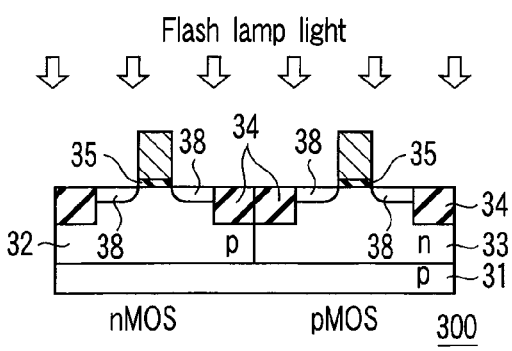

By the activation heat treatment explained above, As and B implanted into the impurity implanted layers 37 are incorporated into the crystal lattice and activated. As a result, as shown in FIG. 3D, n-type and p-type active layers 38 are formed between both ends of the gate insulating films 35 and the element isolation regions 34.

Figure 3E:
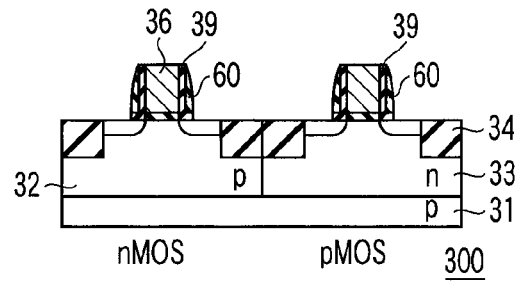

Next, a silicon oxide (SiO$_2$) film 39 and silicon nitride (Si$_3$N$_4$) film 60 are sequentially deposited by a low pressure chemical vapor deposition (LPCVD) method. The SiO$_2$ film 39 and Si$_3$N$_4$ film 60 are etched by the RIE method and selectively left behind on the side surfaces of the gate electrodes 36 and gate insulating films 35. Thus, the side wall spacers 39, 60 formed of the SiO$_2$ films and Si$_3$N$_4$ films, as shown in FIG. 3E, are formed.

Figure 3F:
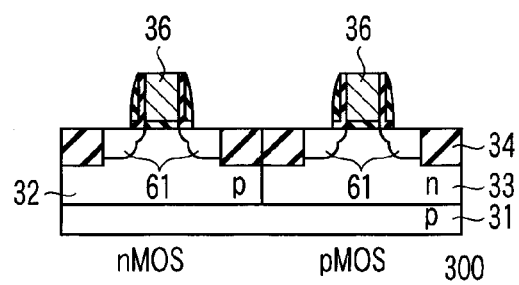

Then, as shown in FIG. 3F, Group-V atoms used as an n-type impurity, for example, P is ion-implanted into the surface portion of the p-well layer 32 with the gate electrodes 36 and side wall spacers 39, 60 used as a mask. Under the ion-implantation condition of P, the acceleration energy is set to 7 keV and the dose amount is set to $3 \times 10^{15}$ cm$^{-2}$, for example. Next, Group-III atoms used as an p-type impurity, for example, B is ion-implanted into the surface portion of the n-well layer 33. Under the ion-implantation conditions of B, the acceleration energy is set to 2 keV and the dose amount is set to $3 \times 10^{15}$ cm$^{-2}$, for example.

Through use of the above ion-implantation processes, source and drain impurity regions 61, which are separated from the end portions of the gate electrodes 36 and formed in contact with the element isolation regions 34, are formed as shown in FIG. 3F. Further, by use of the above ion-implantation processes, corresponding impurity ions are implanted into the gate electrodes 36.

After this, the semiconductor substrate 31 is placed again on the substrate stage 7 of the heat treatment apparatus shown in FIG. 1. The conditions of the activation heat treatment performed at this time are the same as those of the activation heat treatment performed as shown in FIG. 3D. The semiconductor substrate 31 is supplementally heated on the rear surface side by the auxiliary heating sources 8 of the substrate stage 7 to set the central portion to 450° C. and set the outer peripheral portion to 450° C. to 580° C., for example. The flash lamp light of the light source 3 is applied to the front surface side of the semiconductor substrate 31 under the conditions of a pulse width of 1 ms and application energy of 30 J/cm$^2$, for example, while the auxiliary heating state of the semiconductor substrate 31 is maintained.

Figure 3G:
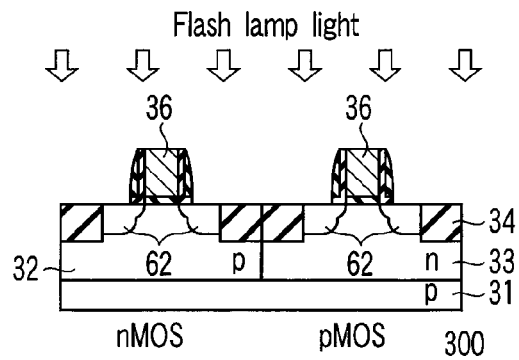

By use of the activation heat treatment, P and B implanted into the impurity doped layers 61 are incorporated into the crystal lattice, taken in and activated. As a result, as shown in FIG. 3G, n-type and p-type active layers 62 are formed between both ends of the gate insulating films 35 and the element isolation regions 34.

Next, by an interlayer insulating film formation process (not shown), an interlayer insulating film, such as an SiO$_2$ film or the like, is deposited on the surface of the semiconductor substrate 31. Then, contact holes are formed in portions of the interlayer insulating film which lie on the n-type and p-type active layers 62 corresponding to the gate electrodes 36 and source and drain regions. Wires are connected to the gate electrodes 36 and n-type and p-type active layers 62 via the respective contact holes. Thus, a semiconductor device 300 is manufactured.

Figure 8:
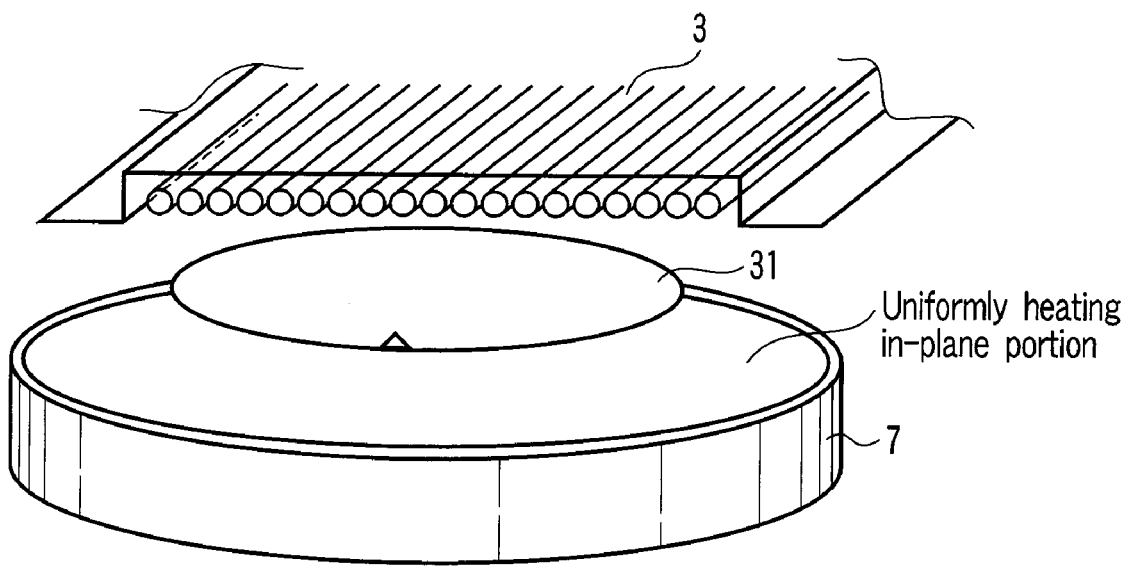
FIG. 8 is a perspective view for illustrating the activation heat treatment method of a comparison example.

For comparison with the present embodiment, as shown in FIG. 8, a comparison example in which the flash lamp 3 is lit in the same manner as in the present embodiment and an ultra high-speed annealing process is performed while the auxiliary heating sources 8 are controlled to set the in-plane temperature distribution of the semiconductor substrate 31 uniform is explained below.

Figure 9:
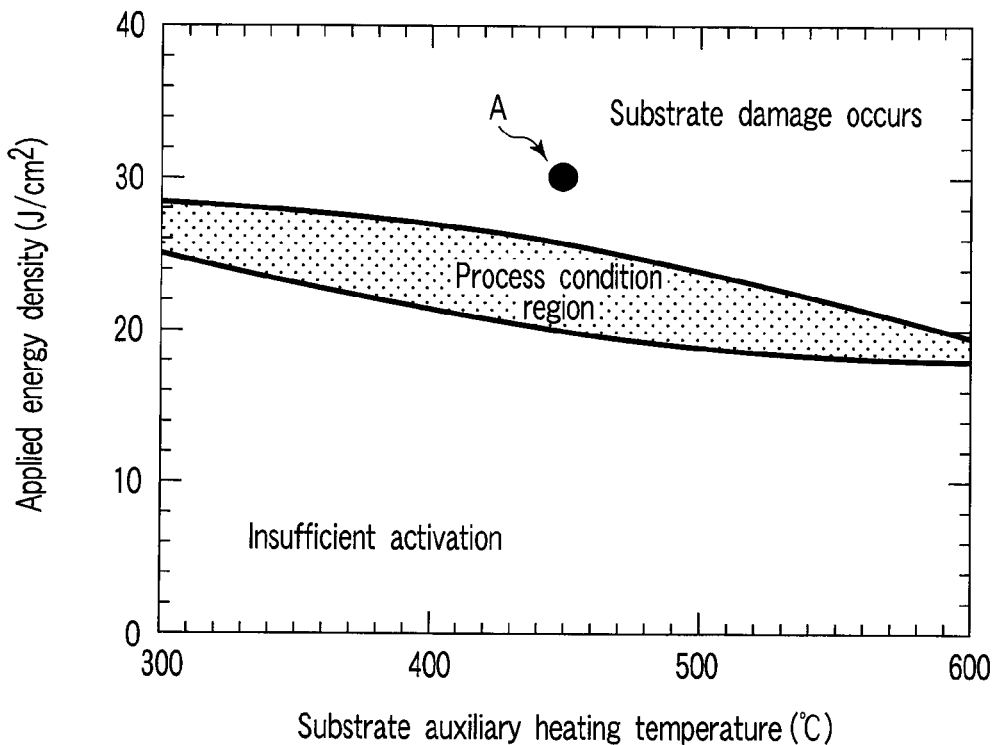
FIG. 9 is a diagram showing a process condition region of the comparison example shown in FIG. 8.

In the comparison example, it is found that the semiconductor substrate 31 is broken after performing the ultra high-speed annealing process and slips occur at high density when the outer peripheral portion of the semiconductor substrate 31 is observed. Further, the experiment is performed and the relation between the substrate auxiliary heating temperature of the central portion of the semiconductor substrate 31 and the application energy thereof is studied from the viewpoint of occurrence of substrate damage such as slips. As the result of the study, as shown in FIG. 9, it is found that the process window (the tolerance range of the application energy density) of the "process condition region" is reduced to ½ or less.

In the comparison example, the in-plane temperature distribution of the semiconductor substrate 31 is kept uniform by the auxiliary heating sources 8. However, in the process for heating the semiconductor substrate 31 from above the upper surface thereof by the flash lamp 3, the temperature of the central portion tends to become higher since the solid angles made when viewing the flash lamp from the central portion and the outer peripheral portion of the semiconductor substrate are different. In addition, heat tends to escape from the outer peripheral portion since the outer peripheral portion is exposed to the outside air. Therefore, in a case where the auxiliary heating temperature is set with the same temperature balance, the temperature of the outer peripheral portion becomes lower than that of the central portion when considering the above heating process in combination with the process for heating the semiconductor substrate from above the upper surface thereof by the flash lamp 3.

Figure 10:
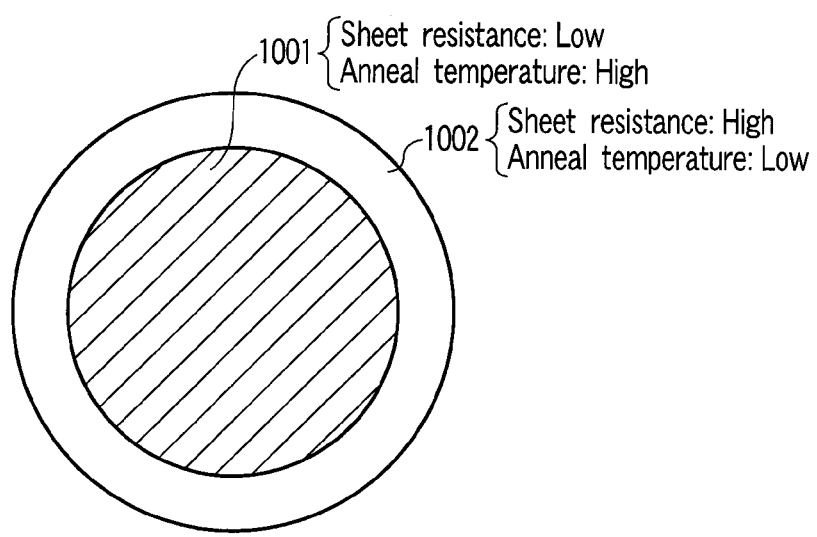
FIG. 10 is a plan view showing the in-plane sheet resistance distribution of a semiconductor substrate when the activation heat treatment is performed under the condition of the comparison example shown in FIG. 8.

The sheet resistance distribution of the substrate when the annealing process is performed in the method of the comparison example is shown in FIG. 10. As shown in FIG. 10, it is suggested that the sheet resistance is low and the effective anneal temperature is high in a central portion 1001 of the wafer, but the sheet resistance is high and the effective anneal temperature is low in an outer peripheral portion 1002.

That is, tensile stress occurs in the outer peripheral portion of the semiconductor substrate from the viewpoint of stress since the temperature of the central portion becomes high and the temperature of the outer peripheral portion becomes low in the anneal method in the comparison example. As a result, it is considered that slips and dislocations tend to be induced in the outer peripheral portion of the semiconductor substrate, finally resulting in cracks. Generally, it is proved, based on photos taken with a high-speed camera, that the semiconductor substrate tends to be cracked starting from the outer peripheral portion and it is considered that cracking of the substrate is triggered by the tensile stress.

The present embodiment is explained by using the activation heat treatment process for ion-implanted impurities, for example, phosphorus (P) or arsenic (As) as the n-type impurity and boron (B) as the p-type impurity. However, the heat treatment process explained above is not limited to the impurity activation heat treatment process. For example, it is of course possible to apply the above heat treatment process to a heat treatment process for forming insulating films such as oxide films and nitride films, forming amorphous Si or poly-Si crystal into a single crystal form or making the crystal larger.

Second Embodiment

In a manufacturing method of a semiconductor device according to a second embodiment of this invention, the temperature balance of the heat treatment condition is adjusted not on the auxiliary heating side of the semiconductor substrate but on the side of a plurality of flash lamps, to set the temperature of the outer peripheral portion of the semiconductor substrate higher than that of the central portion thereof, unlike the first embodiment, when the heat treatment is performed by use of the heat treatment apparatus 100 shown in FIG. 1.

That is, the light source 3 shown in FIG. 1 is configured by a plurality of flash lamps 111 and 112 as shown in FIG. 11. FIG. 11 shows the state of the light source 3 as viewed from the semiconductor substrate 31. Each of the flash lamps 111 and 112 emits pulse-like flash lamp light of 0.1 ms to 100 ms.

In the present embodiment, the control operation is performed to set the intensity of light emitted from the outer flash lamps 112 higher than that of light emitted from the inner flash lamps 111. Thus, like the first embodiment, the non-element region of the outer peripheral portion having a width corresponding to 1 to 5% of the diameter of the semiconductor substrate 31 can be heated to a temperature higher than that of the central portion by 1 to 10%. In this case, the auxiliary heating sources 8 are not necessarily provided in a plural form, and a single auxiliary heating source 8 of the same size as that of the area of the substrate can be used to uniformly heat the rear surface of the semiconductor substrate 31.

Further, as a modification of the present embodiment, as shown in FIG. 12, the reflectance of a lamp reflector (reflection plate) 12, which is provided on the side opposite to the side of the semiconductor substrate 31 with respect to the flash lamp 3 to reflect the flash lamp light towards the semiconductor substrate 31, can be changed in the plane.

More specifically, the reflectance of light traveling towards the outer peripheral portion is set higher than that of light traveling towards the central portion by attaching a material for lowering the reflectance to a region of the lamp reflector 12 which passes the reflected light to the central portion of the semiconductor substrate 31, or lowering the degree of brilliance of the above portion by polishing.

Further, as another modification of the present embodiment, as shown in FIG. 13, the intensity of the light applied from the flash lamps on both outermost sides among the plurality of flash lamps arranged side by side to configure the light source 3 is set higher than the intensity of light applied from the inner flash lamps. In addition, the auxiliary heating sources on the rear surface side of the semiconductor substrate 31 are replaced by a plurality of halogen lamps arranged in a direction perpendicular to an arrangement direction of the plurality of flash lamps and the intensity of light applied from the halogen lamps on both outermost sides among the plurality of halogen lamps is set higher than the intensity of light applied from the inner halogen lamps. Thus, it is possible to selectively heat the outer peripheral portion from both of the front and rear surface sides of the semiconductor substrate 31 to a high temperature.

Third Embodiment

In a manufacturing method of a semiconductor device according to a third embodiment of this invention, unlike the first and second embodiments, it is featured that the absorption factor of flash lamp light in the outer peripheral portion on the semiconductor substrate side is enhanced without controlling the anneal condition on the device side.

Generally, a pattern element portion is formed on the central portion of the main surface of the semiconductor substrate, but a non-pattern portion or a dummy pattern having coarse dimensions is formed on the outer peripheral portion. Further, in the spectrum having a light source such as a flash lamp in a visible light region, the effective temperature becomes high in a region in which the pattern is densely formed even if the same anneal condition is set on the device side. Therefore, the temperature tends to become lower in the outer peripheral portion of the substrate. That is, in the manufacturing method of a semiconductor device used to date, when the flash anneal is performed, the semiconductor substrate tends to be cracked.

Therefore, in the present embodiment, as shown in FIG. 14, a film which causes the absorption factor of pulse-like flash lamp light of 0.1 ms to 100 ms to be enhanced is formed on an outer peripheral portion 140 of the semiconductor substrate on which a pattern element portion used as a product portion is not formed so that the temperature thereof will be enhanced and breakage of the substrate can be suppressed.

The absorption factor of the central portion of the semiconductor substrate on which the pattern element portion is formed is approximately 80 to 85%. However, if a carbon film is formed on the outer peripheral portion 140, which is a non-element region, having a width corresponding to 1 to 5% of the diameter, for example, the absorption factor of the region is increased to 90%.

Further, the absorption factor can be enhanced by forming an oxide ($SiO_2$) film, nitride ($Si_3N_4$) film or a multi-layered insulating film such as a multi-layered oxynitride film, which is a laminated film of the above films, on the outer peripheral portion 140 as a different method. For example, as shown in FIG. 15, the absorption factor for the flash lamp light is enhanced to 88% by sequentially laminating an $Si_3N_4$ film 151 of the refractive index n=2 to the thickness of 40 nm and an $SiO_2$ film 152 of n=1.4 to the thickness of 60 nm on a semiconductor substrate 150 of n=4 to 5.

Figure 16:
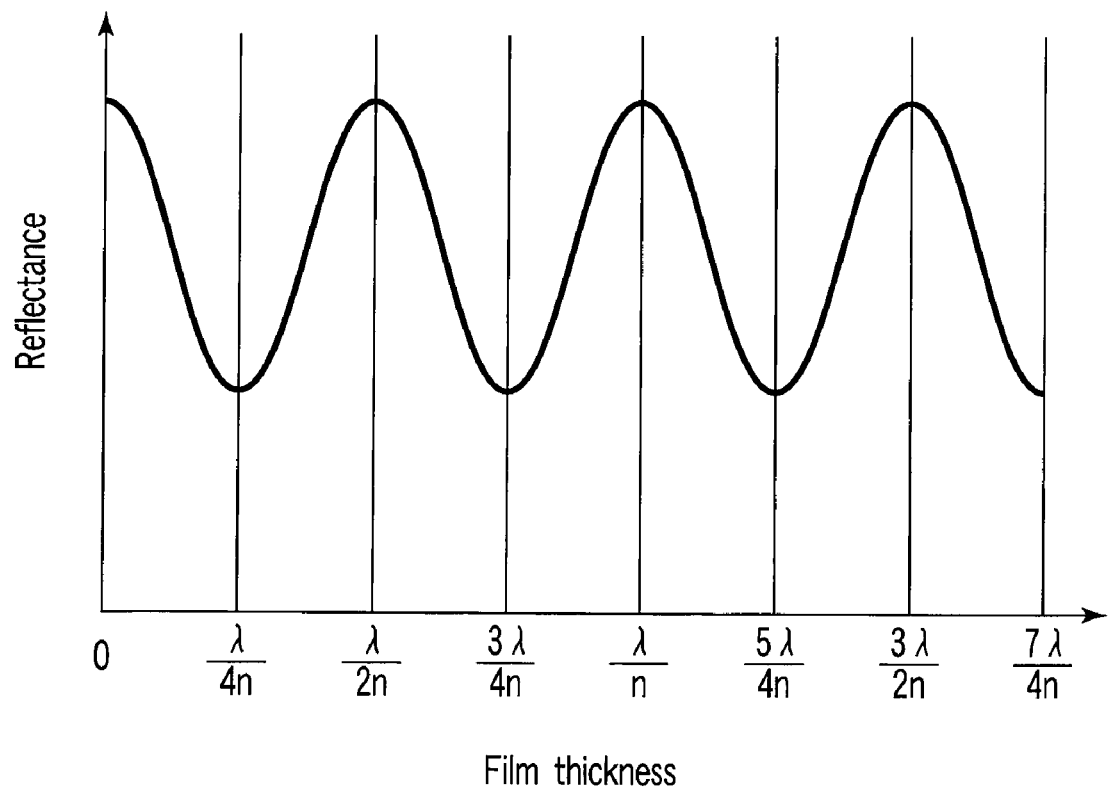
FIG. 16 is a diagram showing the relation between the reflectance and the film thickness when the ratio of the wavelength λ of the flash lamp light and the refractive index n of the film is used as the unit.
Figure 17:
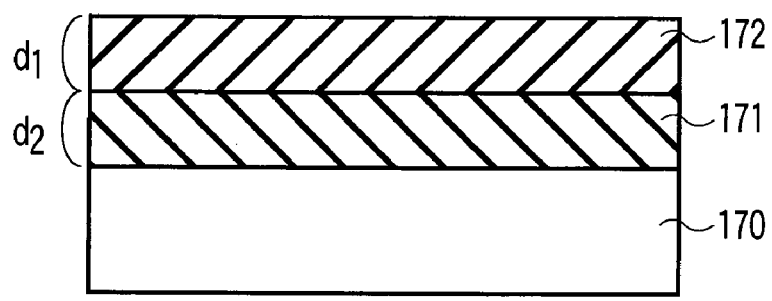
FIG. 17 is a cross sectional view showing the film structure of the outer peripheral portion of the semiconductor substrate, for illustrating the manufacturing method of the semiconductor device according to the third embodiment of this invention.

Generally, the relation between the reflectance and the film thickness expressed by using the ratio of the wavelength λ of the flash lamp and the refractive index n of the film as the unit is shown in FIG. 16. Therefore, as shown in FIG. 17, in the case of the structure in which a second film 171 of the film thickness $d_2$ with the refractive index $n_2$ and a first film 172 of the film thickness $d_1$ with the refractive index $n_1$ are sequentially formed on a semiconductor substrate 170, the relation between the refractive index and the film thickness of the multi-layered insulating film in which the absorption factor can be enhanced by lowering the reflectance can be expressed as follows when the wavelength of the maximum intensity of the flash lamp light is set to λ.

$$n_{air} < n_1 < n_2 < n_{Si} (2j-1)\lambda/(4n_1) - \lambda/(8n_1) < d_1 < (2j-1)\lambda/(4n_1) + \lambda/(8n_1)(2k-1)\lambda/(4n_1) - \lambda/(8n_1) < d_2 < (2k-1)\lambda/(4n_1) + \lambda/(8n_1) \quad (1)$$

where $n_{air}$ is the refractive index of air, $n_{Si}$ is the refractive index of a silicon substrate and j, k are positive integral numbers.

Further, as a means for enhancing the absorption factor of the semiconductor substrate, a method for forming a dummy pattern having a higher density in the element dimensions than the pattern element portion of the central portion on the outer peripheral portion is also possible. Based on the experimental result, it is confirmed that the absorption factor can be enhanced by approximately 4% by enhancing the pattern density by 1.5 times.

As described above, according to the present embodiment, the anneal temperature can be enhanced in a desired limited region of the outer peripheral portion while the standard deviation σ of the in-plane distribution of the sheet resistance of the pattern element region required for products is kept lower than 1%. Therefore, substrate damage at the flash anneal time can be avoided while the degree of in-plane uniformity of the heat treatment temperature in the pattern element portion required for the product is enhanced. As a result, the manufacturing yield in the heat treatment process can be enhanced while variations in the electrical characteristics of the semiconductor device are suppressed.

Further, in the first to third embodiments, it is proved, based on the experimental results, that the occurrence of damage of the semiconductor substrate can be suppressed by setting the temperature of the outer peripheral portion, which is to be set to a high temperature in a doughnut-form region of the outer edge portion corresponding to the width of 1 to 5% of the diameter, higher than that of the central portion by 1 to 10%.

That is, in a region with a width less than 1% of the diameter, the area is small, and therefore, a sufficient effect cannot be attained even if the temperature of the region is set higher than that of the central portion. On the other hand, in a region with a width of 5% or more of the diameter, it becomes difficult to attain sufficiently high cracking resistance, which is due to an increase in the degree of thermal stress caused by an increase in the area. Further, the quality of the product is adversely affected as the product is formed nearer to the outer peripheral portion.

Further, since the tensile stress component begins to disappear if the percentage by which the temperature of the outer peripheral portion is higher than the temperature of the central portion is less than 1%, a sufficiently large process window cannot be attained. On the other hand, if the percentage is 10% or more, compressive stress is applied to the outer peripheral portion but the temperature difference becomes larger. Therefore, slips and dislocations frequently occur and it is proved that a worse influence is exerted on the quality of the product, as the product is formed nearer to the outer peripheral portion.

As described above, in the present embodiment, the Xe flash lamp is used as the light source 3 of FIG. 1. However, the light source 3 is not limited to the Xe flash lamp and, for example, it is possible to use a flash lamp using another rare gas, such as mercury or hydrogen, a laser such as an excimer laser, YAG laser, carbon monoxide gas (CO) laser or carbon dioxide ($CO_2$) laser, or a light source capable of emitting light with high luminance, such as an Xe arc discharge lamp. Further, as the flash lamp, a structure having a plurality of lamp elements is explained, but the structure of the flash lamp is not limited to the above case. For example, a single-end type flash lamp can be used.

Also, in the first embodiment, the light source is not limited to the Xe flash lamp, and various types of light sources can be used, as in the third embodiment. Of course, the structure of the flash lamp is not limited to that explained in the above embodiment.

Further, in the first and third embodiments, the effect can be attained even if the flash lamp or laser is used, but a better effect can be attained when using a flash lamp than a laser, since the flash lamp can simultaneously apply light to the entire surface of the wafer. Thus, a stable and high-performance semiconductor device can be manufactured.

As described above, in the manufacturing method of the semiconductor device according to the first to third embodiments, the tensile stress of the outer peripheral portion is reduced and the wafer cracking resistance is enhanced by heating the outer peripheral portion of the semiconductor substrate to a higher temperature. Further, the entire surface of the wafer can be heated without degrading the in-plane uniformity of a product portion by forming a film used to enhance the absorption factor with respect to flash lamp light on the outer peripheral portion other than the product portion, or forming a dummy pattern having higher density in the element dimensions than the central product portion.

Therefore, since the thermal stress resistance of the substrate with respect to a rapid temperature rise is enhanced in comparison with a substrate having a large area, the process window is enlarged and the process is stabilized. Further, high-performance transistors can be manufactured since the in-plane uniformity of the electrical characteristic of the semiconductor element is improved and the miniaturization thereof can be more easily attained.

Fourth Embodiment

A manufacturing method of a semiconductor device according to a fourth embodiment of this invention is explained below.

In this embodiment, an activation heat treatment is performed by applying flash lamp light to the semiconductor substrate in a state where the pressure of a chamber in which the semiconductor substrate is arranged is kept lowered.

In this case, the manufacturing process of a transistor 400 with a CMOS configuration in which extension regions are later formed is explained as an example.

Figure 18A:
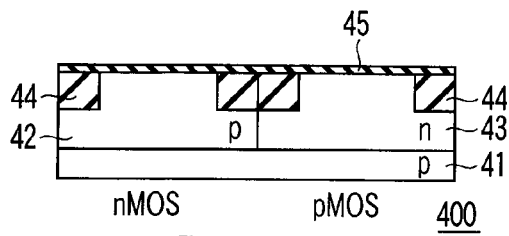
FIGS. 18A to 18I are cross sectional views sequentially showing the manufacturing steps of a transistor with the CMOS configuration in a manufacturing method of a semiconductor device according to a fourth embodiment of this invention.

First, as shown in FIG. 18A, a p-well layer 42 is formed in an nMOS region of a p-type silicon (Si) substrate 41 and an n-well layer 43 is formed in a pMOS region. Element isolation regions 44 are formed around the periphery of the p-well layer 42 and the periphery of the n-well layer 43. Then, a silicon oxide film, used as a gate insulating film 45, is formed above the surface of the silicon substrate 41.

Figure 18F:
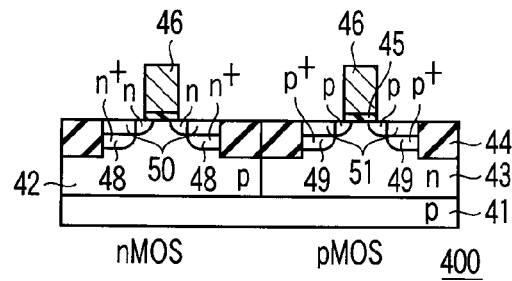
Figure 18B:
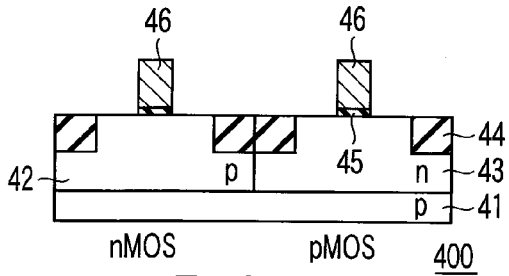

Next, as shown in FIG. 18B, a gate insulating film 46, formed of polysilicon, is formed on the gate insulating film 45. Then, the polysilicon film is selectively etched by a reactive ion etching (RIE) method to form gate electrodes 46.

After this, a silicon nitride ($Si_3N_4$) film 47 is sequentially deposited by a low pressure chemical vapor deposition (LPCVD) method. The silicon nitride film 47 is etched by the RIE method and selectively left behind on the side surfaces of the gate electrodes 46 and gate insulating films 45. Thus, side wall spacers 47, which are formed of silicon nitride, as shown in FIG. 18C, are formed.

Next, the surface of the n-type well layer 43 is masked with a photoresist film (not shown). Then, source and drain impurity regions 48 are formed by ion-implanting Group-V atoms such as arsenic (As), used as an n-type impurity, into the surface of the p-type well layer 42 with the gate electrodes 46 and side wall spacers 47 used as a mask (FIG. 18D). The ion-implantation conditions set are an acceleration energy of 20 keV and dose amount of $5 \times 10^{15}$ $cm^{-2}$.

After the photoresist film is removed, the surface of the p-type well layer 42 is masked with a photoresist film (not shown). Then, source and drain impurity regions 49 are formed by ion-implanting Group-III atoms such as boron (B), used as a p-type impurity, into the surface of the n-type well layer 43 with the gate electrodes 46 and side wall spacers 47 used as a mask. The ion-implantation conditions set are an acceleration energy of 3 keV and dose amount of $5 \times 10^{15}$ $cm^{-2}$.

As shown in FIG. 18D, the source and drain impurity regions 48 and 49, which are separated from the end portions of the gate electrodes 46 and formed in contact with the element isolation regions 44, are formed in the silicon substrate 41 by the above processes. Further, corresponding impurity ions are also implanted into the gate electrodes 46 by the above ion-implantation processes.

Next, a halogen lamp is used as a heat source to perform a spike RTA process, which is the activation heat treatment for the silicon substrate 41 (not shown). The temperature condition of the spike RTA process is set to 1050° C. The impurities implanted into the gate electrodes 46 can be diffused to the interfaces of the gate insulating films 45 by the activation heat treatment, and crystal defects caused in the silicon substrate 41 by ion-implantation can be eliminated.

Figure 18G:
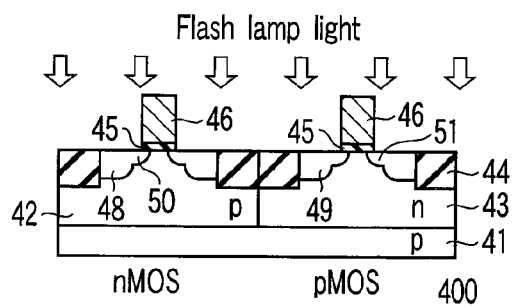
Figure 18C:
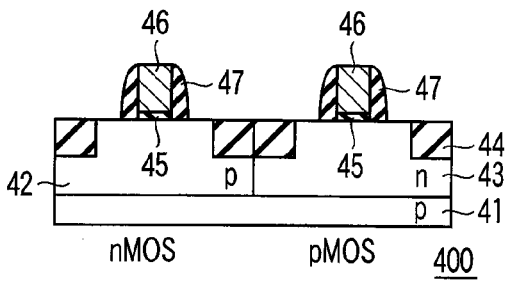
Figure 18H:
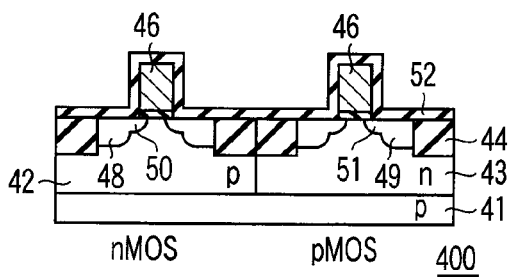
Figure 18D:
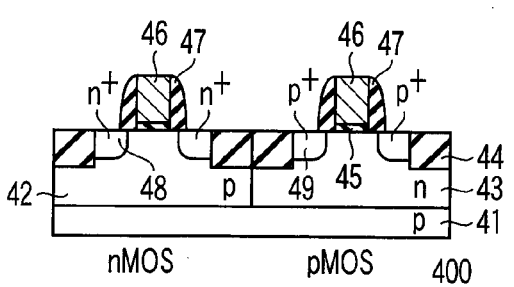
Figure 18I:
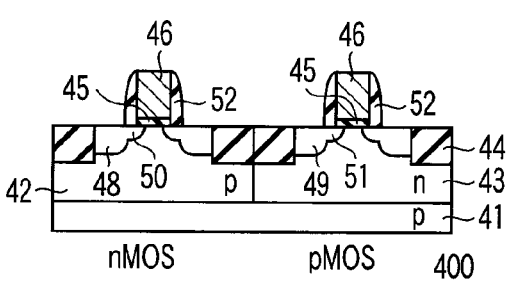
Figure 18E:
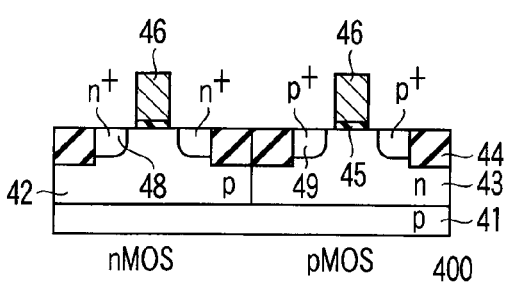

Next, as shown in FIG. 18E, the side wall spacers 47, which are formed of silicon nitride, are removed by using hot phosphoric acid.

After this, the pMOS region is masked with a photoresist film (not shown). Then, source and drain extension impurity regions 50 are formed by ion-implanting Group-V atoms such as arsenic (As), used as an n-type impurity, into the surface of the p-type well layer 42 on the surface of the silicon substrate 41 with the gate electrodes 46 of the nMOS region used as a mask (FIG. 18F). The ion-implantation conditions set are an acceleration energy of 2 keV and dose amount of $1\times10^{15}$ cm$^{-2}$.

After the photoresist film is removed, the surface of the p-type well layer 42 is masked with a photoresist film (not shown). Then, source and drain extension impurity regions 51 are formed by ion-implanting Group-III atoms such as boron (B), used as a p-type impurity, into the surface of the n-type well layer 43, with the gate electrodes 46 used as a mask. The ion-implantation conditions set are an acceleration energy of 0.5 keV and dose amount of $1\times10^{15}$ cm$^{-2}$.

Thus, as shown in FIG. 18F, the shallow source and drain extension impurity regions 50 and 51, which are adjacent to the gate electrodes 46 and element isolation regions 44, are formed in the silicon substrate 41 by the above processes.

Next, as shown in FIG. 18G, a flash lamp is used as a heat source to perform the activation heat treatment. As shown in FIG. 19, the annealing process is performed by placing the silicon substrate 41 on a susceptor 192 provided on a hot plate 191, supplementally heating the rear surface thereof and heating the front surface of the silicon substrate 41 by use of light radiated from the flash lamp light source 3 in this state. The transparent window 5 is provided on the upper portion of the chamber 190 in which the activation heat treatment is performed, and flash lamp light emitted from the light source 3 provided above the window passes through the transparent window 5 to be applied to and heat the silicon substrate 41. Light radiated from the flash lamp light source 3 is flash light having a pulse width of 0.1 ms to 100 ms, which is used to perform the ultra high-speed annealing process.

In the present embodiment, light having a pulse width of 1 ms with an energy density of 30 J/cm² is applied while the pressure in the chamber 190 in which the activation heat treatment is performed is lowered to 1 kgf/cm² and the silicon substrate 41 is supplementally heated at 500° C.

In this case, the auxiliary heating temperature of the silicon substrate 41 is preferably set in the range of approximately 200° C. to 900° C. and is more preferably set in the range of 400° C. to 600° C.

If the auxiliary heating temperature is set excessively low, it is necessary to heat the front surface with high light intensity. Therefore, it is not preferable since thermal stress occurring in the silicon substrate 41 is increased and crystal defects such as slips and dislocations will be induced. On the other hand, if the auxiliary heating temperature is set excessively high, this is also not preferable since the impurity is out-diffused.

The possibility that damage such as slips and dislocations will occur in the silicon substrate 41 by auxiliary heating is weak. However, in the auxiliary heating process, it is preferable to set the temperature rise rate as low as possible, for example to 20° C./s or less, so as not to deform the silicon substrate 41. This because a warp tends to occur in the silicon substrate 41 if the temperature rise rate is set higher than the above value, and the silicon substrate 41 is easily broken if flash lamp light is applied in such a warped state.

As the auxiliary heating means, another heating means such as a halogen lamp, which is an infrared lamp, can be used instead of the hot plate.

Xenon flash lamp light applied from above the front surface of the silicon substrate 41 is absorbed by the gate electrodes 46, the extension regions 50 and 51 in the silicon substrate 41 and the source and drain regions 48 and 49 as shown in FIG. 18G. It is considered that the temperatures of the gate electrodes 46, extension regions 50 and 51 and source and drain regions 48 and 49 which absorb the xenon flash lamp light are raised and instantaneously exceed 1100C.

When the temperature is raised to the above temperature, the impurities implanted into the gate electrodes 46, extension regions 50 and 51 and source and drain regions 48 and 49 are electrically activated. By such activation, the resistances of the gate electrodes 46, extension regions 50 and 51 and source and drain regions 48 and 49 are lowered.

Next, as shown in FIG. 18H, a silicon nitride ($Si_3N_4$) film or silicon oxide ($SiO_2$) film 52 is deposited by use of a low pressure chemical vapor deposition (LPCVD) method performed at a film formation temperature of 600° C. or less.

Then, as shown in FIG. 18I, the silicon nitride film or silicon oxide film 52 is etched by use of the RIE method and selectively left behind on the side surfaces of the gate electrodes 46 and gate insulating films 45. As a result, side wall spacers 52, formed of the silicon nitride film or silicon oxide film, are formed. The side wall spacers 52 play a role of preventing an Ni silicide reaction in a later step.

The manufacturing process after the step of FIG. 18I is not shown. Then, an Ni film is formed on the gate electrodes 46 and source and drain regions 48 and 49 and silicided by the RTA process, and non-reacted Ni is removed by use of hydrolytic sulfate. After this, a silicon oxide film used as an inter-layer insulating film is deposited and contact holes are formed therein. Wires are connected to the gate electrodes 46 and source and drain regions 48 and 49 via the contact holes.

As described above, a semiconductor device 400 with a MOS structure having shallow impurity diffusion regions of 20 nm or less is completed.

After this, the resistances of the extension regions 50 and 51 were measured and it was confirmed that the resistances were sufficiently low in the present embodiment, and that activation of the impurity regions was sufficiently performed. Further, the in-plane variation σ of the sheet resistance of a plurality of elements arranged on the silicon substrate 41 was suppressed to 1% or less.

The impurity profile of the extension regions 50 and 51 in the depth direction was measured by use of a secondary ion mass spectroscopy (SIMS) method. As a result, it was found that a shallow diffusion layer with a junction depth of 15 nm was formed and impurity diffusion was suppressed.

Further, the crystal states of the extension regions 50 and 51, or mainly the presence or absence of the crystal defects such as dislocations after the annealing process, was observed by use of a transmission electron microscope (TEM). As a result, the crystal defects such as dislocations were not observed in the extension regions 50 and 51 after the annealing process.

In order to make a comparison with the present embodiment, the activation heat treatment performed in the step of FIG. 18G was performed by changing only the pressure P of the chamber under the condition that P was set at a normal pressure of P=1 kgf/cm² for comparison example 1, and at a low pressure of P=0.001 kgf/cm² for comparison example 2. The other conditions were the same as those in the present embodiment.

As a result, it was proved that a to-be-processed semiconductor substrate was less likely to crack if the activation heat treatment was performed by use of the anneal method of the present embodiment in comparison with the anneal method of the comparison examples 1 and 2.

More specifically, in the anneal method of the present embodiment, the process was performed without cracking even one of 100 wafers. On the other hand, in the anneal method of the comparison example 1, 23 out of 100 wafers were broken into pieces of approximately 1 cm square. Further, of the wafers which were not broken into pieces and maintained their original form, it was found that 50% or more were warped, slip dislocations were observed in the semiconductor layers and thus damages occurred. Further, slip dislocations were observed in the semiconductor layers, which also caused damage. Further, in the anneal method of the comparison example 2, cracks were observed in eight out of 100 wafers, but unlike the breakage state of the comparison example 1, the wafers were cracked into approximately two to five pieces.

Based on the above results, boundary lines at which the frequency of occurrence of damage (breakage, slip dislocations) in the wafers become equal to or lower than 1% are shown in FIG. 20, with the substrate auxiliary heating temperature T (° C.) indicated on the abscissa and the application energy density E (J/cm$^2$) indicated on the ordinate for the present embodiment and comparison examples 1 and 2. The frequency of occurrence of damage becomes equal to or higher than 1% in the upper region above the boundary line.

Further, the dotted lines in FIG. 20 show a boundary line indicating whether or not the implantation defects in the extension regions 50 and 51 had sufficiently recovered. The upper region above the boundary line is set in an anneal condition in which no secondary defect occurs in the visual field of 500 nm×500 nm. The lower region below the boundary line indicates a region in which implantation defects had not sufficiently recovered.

The region between the solid line and the dotted lines is the region of the tolerated process condition, that is, process condition region (process window). As is understood from FIG. 20, the process condition region in a case where a semiconductor device is manufactured with the pressure in the chamber of the comparison example is narrower than the process condition region with the pressure in the chamber of the present embodiment.

In the above case, the annealing process was performed under process conditions 20 of an auxiliary heating temperature of 500° C. and application energy density of 30 J/cm$^2$ for the present embodiment and the comparison examples 1 and 2 when manufacturing the semiconductor device. As shown in FIG. 20, it is understood that the process conditions 20 lie outside the pressure process condition region of comparison examples 1 and 2 but lie inside the pressure process condition region of the present embodiment.

Figure 23:
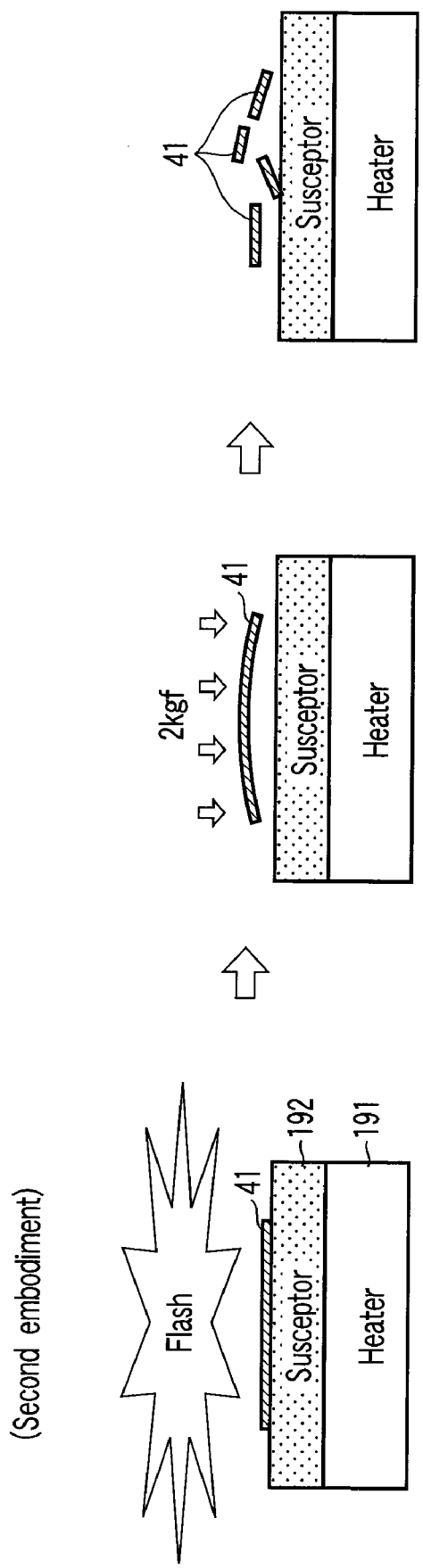
FIG. 23 is a schematic diagram showing a variation in the wafer state after application of light by the flash lamp in the comparison example 2.

Differences between the results obtained in the present embodiment and the comparison examples 1 and 2 are considered below. FIGS. 21 to 23 are schematic diagrams showing variations in the states of wafers after application of flash lamp light in the present embodiment and the comparison examples 1 and 2. In each case, an auxiliary heater 191 (such as a hot plate) is arranged in contact with the rear surface of a susceptor 192, and a silicon substrate 41 is set on the upper surface of the susceptor 192. Heat from the heater 191 is transmitted to the silicon substrate 41 by heat conduction.

In each of the present embodiment and the comparison examples 1 and 2, the surface temperature of the silicon substrate 41 rapidly rises after application of flash lamp light and reaches 1300° C. at maximum after approximately 1 ms. At this time, since the heat of the flash lamp light does not reach the rear surface of the silicon substrate 41, the rear surface temperature is controlled by the auxiliary heater 191 and a temperature difference approximately equal to 800° C. occurs between the front surface and the rear surface. Since only the front surface of the silicon substrate 41 is heated to a high temperature, the front surface of the silicon substrate 41 is deformed in a convex form immediately after application of the flash lamp light as shown in FIGS. 21 to 23.

As shown in FIGS. 21 and 22, which indicate the present embodiment and the comparison example 1, the rear surface of the silicon substrate 41 and the front surface of the susceptor 192 are initially set in close contact with each other. However, a vacuum layer is formed between the rear surface of the silicon substrate 41 and the front surface of the susceptor 192 at the same time that the silicon substrate 41 is deformed in a convex form. At the same time, the upper surface of the silicon substrate 41 is instantaneously heated to a high temperature, and as a result, atmospheric gas explosively expands and a high pressure is applied to the wafer surface.

At this time, since the pressure in the chamber is normal in the case of the comparison example 1, the pressure applied from above the upper surface of the silicon substrate 41 becomes higher than in the present embodiment, in which the pressure is lowered. The pressure is controlled depending on the application energy of the flash lamp, but is lower under the same application energy in the present embodiment, in which a low pressure is set.

According to calculations made based on a wafer diameter of 300 mmϕ, it is predicted that a load of approximately 1600 kgf is applied to the silicon substrate 41 under the normal pressure of comparison example 1 and a load of approximately 160 kgf, which is 1/10 the above value, is applied under a low pressure in the case of the present embodiment. In these cases, since the vacuum layer is formed on the rear surface, no pressure is applied to the rear surface.

If the load applied to the silicon substrate 41 is reduced, the amount of damage occurring in the silicon substrate 41 becomes small. That is, it is considered that the amount of damage (cracking frequency) of the silicon substrate 41 is controlled according to the difference between the pressures applied to the front and rear surfaces of the silicon substrate 41. Therefore, in the case of the present embodiment, in which an ultra high-speed annealing process is performed under a low pressure, the frequency of breakage due to fragility of the silicon substrate 41 can be lowered in comparison with comparison example 1.

In the case of the comparison example 2, the pressure is set lower than in the present embodiment and it is predicted that the load applied to the front surface of the silicon substrate 41 is 2 kgf or less, but the wafer cracking frequency is high. In this case, it is proved, based on verification by use of a high-speed camera, that since the load applied from above the upper surface of the silicon substrate 41 is smaller, the counter-reaction of the silicon substrate, in which the silicon substrate 41 reflexes in a convex form, leads to the silicon substrate 41 jumping out and impacting against the chamber window, cracking the silicon substrate 41.

That is, the low pressure, which prevents wafer cracks, has a lower limit, and if this is set excessively low, the reaction caused by deformation of the silicon substrate 41 cannot be prevented, and the silicon substrate collides with the obstacle and is cracked. It is therefore understood that it is necessary to apply an adequate amount of load from above the wafer in order to suppress the silicon substrate 41 from jumping out.

Figure 24:
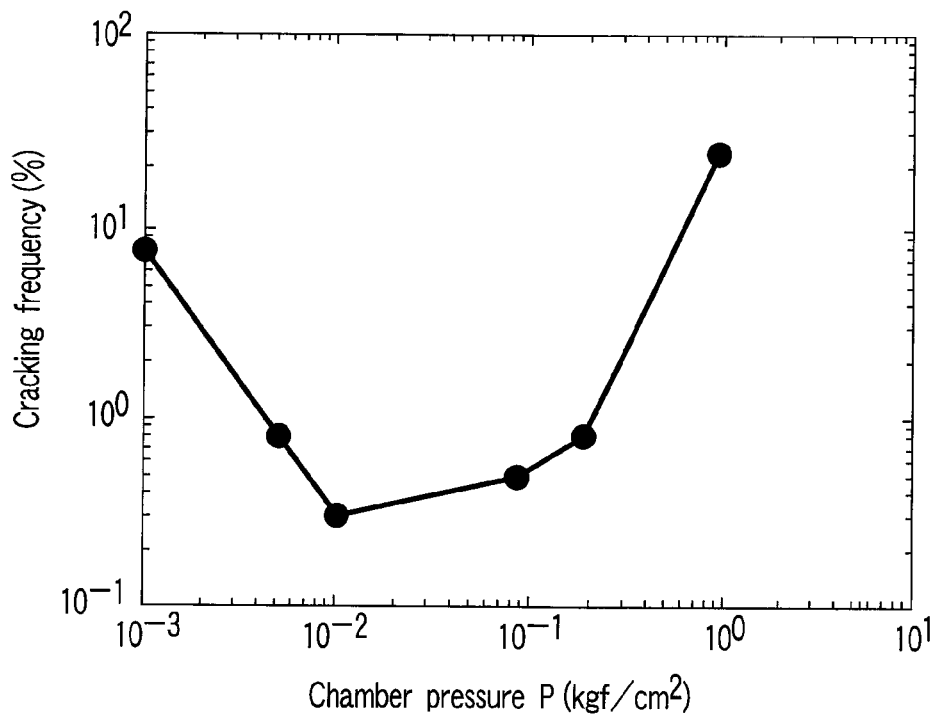
FIG. 24 is a diagram showing the relation between the frequency of wafer cracking and the chamber pressure under the conditions of an auxiliary heating temperature of 500° C., light pulse width of 1 ms and light application energy density of 30 J/cm², for illustrating the manufacturing method of the semiconductor device according to the fourth embodiment of this invention.

FIG. 24 is a characteristic diagram showing the relation between the frequency of wafer cracking and the chamber pressure obtained, based on experiments. The experimental conditions set are light with a pulse width of 1 ms applied with an energy density of 30 J/cm² while the semiconductor layer is supplementally heated at 500° C. Based on this experiment, it is understood that the wafer cracking frequency is 1% or less when the chamber pressure P is set to 0.005 to 0.2 kgf/cm².

Fifth Embodiment

A manufacturing method of a semiconductor device according to a fifth embodiment of this invention is explained below.

In this embodiment, in the activation heat treatment performed in the step of FIG. 18G, an air layer (gap, hole or the like) 250 is provided between the rear surface of the silicon substrate 41 and the front surface of the susceptor 192, and a flash lamp light is applied under a low pressure, as shown in FIG. 25, unlike the case of FIG. 21 in the fourth embodiment. For example, the susceptor 192 is formed to have wafer supporting portions in several positions and the silicon substrate 41 is mounted on the supporting portions to form the air layer 250 between the silicon substrate 41 and the susceptor 192. In this case, the contact area between the silicon substrate 41 and the susceptor 192 is substantially "0".

In FIG. 25, a case where a high-speed annealing process is performed under the condition that the chamber pressure P is lowered to 0.2 kgf/cm² is shown. However, the pressure difference between the front and rear surfaces of the wafer can be further reduced simply by providing an air layer. FIG. 26 shows the variation in the wafer state when the air layer 250 is provided and the ultra high-speed annealing process is performed under normal pressure for comparison with the above case. It is preferable to set the auxiliary heating temperature of the silicon substrate 41 in the range of 200° C. to 900° C. and, more preferably, in the range of 400° C. to 600° C.

Figure 27:
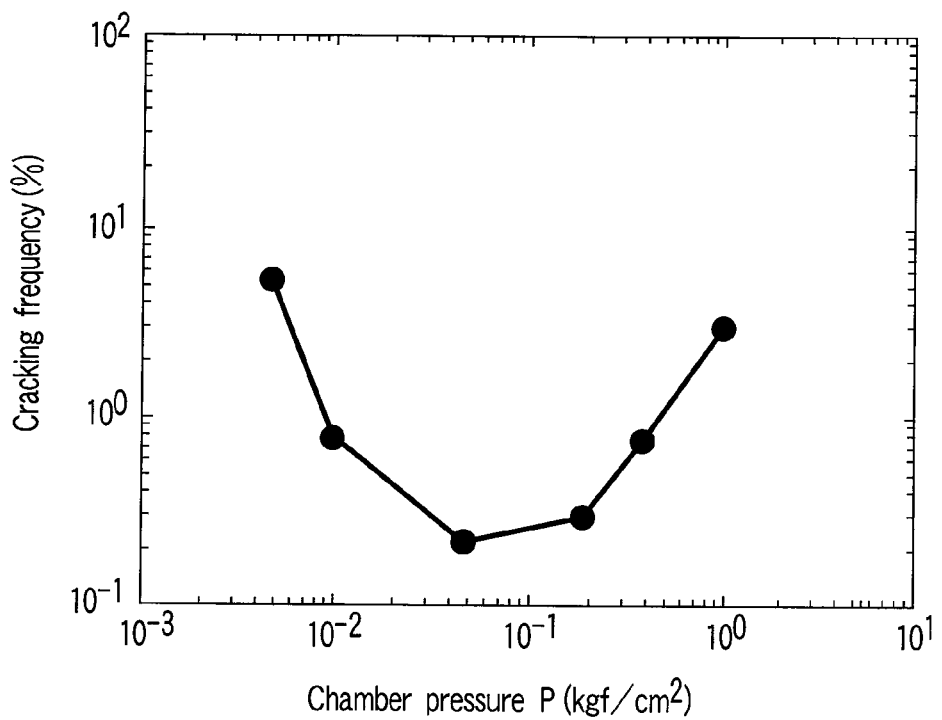
FIG. 27 is a diagram showing the relation between the frequency of wafer cracking and the chamber pressure under the conditions of an auxiliary heating temperature of 500° C., light pulse width of 1 ms and light application energy density of 30 J/cm², for illustrating the manufacturing method of the semiconductor device (air layer is present) according to the fifth embodiment of this invention.

FIG. 27 is a characteristic diagram showing the relation between the frequency of wafer cracking and the chamber pressure obtained based on experiments when an air layer is provided between the rear surface of the wafer and the front surface of the susceptor. The experiment conditions are set so that light with a pulse width of 1 ms is applied with an energy density of 30 J/cm² while the semiconductor layer is supplementally heated at 500° C.

As shown in FIG. 27, in the present embodiment, since the frequency of wafer cracking can be reduced even if the chamber pressure is slightly lowered, the hardware load can be alleviated and the process can be stably performed.

This is considered to be caused by the presence of the air layer between the rear surface of the wafer and the front surface of the susceptor, which causes a pressure difference ΔP between the front and rear surfaces of the wafer to become small. It is understood from FIG. 27 that the frequency of wafer cracking is 1% or less when the chamber pressure P=0.01 to 0.4 kgf/cm².

Therefore, it is understood that the frequency of wafer cracking can be set to 1% or less and the occurrence of slip dislocations can be suppressed irrespective of the shape of the susceptor when the wafer area is set to $W_S$ and the contact area between the wafer and the susceptor is set to $C_S$, and the chamber pressure P is set to $[0.01-0.005(C_S/W_S) \leq P \leq 0.4-0.2(C_S/W_S)$ (kgf/cm²)] by considering the above case together with the result of the fourth embodiment. Thus, a sufficiently high wafer cracking resistance can be attained.

As described above, in the fourth and fifth embodiments, since the resistance to breakage due to fragility of the wafer in the ultra high-speed annealing process can be attained, the process window is enlarged and the process can be stabilized. Further, shallow low-resistance diffusion layers can be formed without causing damage such as slip locations and breakage, thus a high-performance MOS transistor which can be easily miniaturized can be formed.

As described above, according to one aspect of this invention, the manufacturing method of a semiconductor device in which wafer breakage caused by heating stress in an ultra high-speed annealing process can be suppressed can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor device comprising:
supplementally heating a semiconductor substrate from a rear surface of a main surface thereof to set a temperature of an outer peripheral portion of the semiconductor substrate higher than that of a central portion thereof; and
applying one of a pulse-like flash lamp light and laser light of 0.1 ms to 100 ms to the main surface of the semiconductor substrate and performing a heat treatment by use of applied energy while the semiconductor substrate is being supplementally heated,
wherein the heat treatment performed by use of the applied energy is performed in a low-pressure state, and
wherein a pressure value P in the low-pressure state satisfies a relation of $[0.01-0.005(C_S/W_S) \leq P \leq 0.4-0.2(C_S/W_S)$ (kgf/cm²)] when an area of a surface portion of the semiconductor substrate which is supplementally heated is set to $W_S$ and a contact area between the surface portion and a susceptor which makes contact with the surface portion is set to $C_S$.

2. The manufacturing method of the semiconductor device according to claim 1, wherein the supplemental heating is performed by use of an auxiliary heating source which supplementally heats a region having a smaller area than the main surface of the semiconductor substrate from the rear surface thereof.

3. The manufacturing method of the semiconductor device according to claim 1, wherein the supplemental heating is performed for 10 seconds to 120 seconds with the temperature of the central portion of the semiconductor substrate set in a range of 300° C. to 700° C.

4. The manufacturing method of the semiconductor device according to claim 3, wherein the temperature of the central portion of the semiconductor substrate is more preferably set in a range of 400° C. to 600° C.

5. The manufacturing method of the semiconductor device according to claim 1, wherein a temperature of a non-element region of the outer peripheral portion having a width corresponding to 1 to 5% of a diameter of the semiconductor substrate is set higher than that of the central portion by 1 to 10% when one of the pulse-like flash lamp light and laser light is applied.

6. The manufacturing method of the semiconductor device according to claim 1, wherein the pressure in the low-pressure state is set in a range of 0.005 to 0.4 kgf/cm².

7. A manufacturing method of a semiconductor device comprising:
supplementally heating a rear surface of a main surface of a semiconductor substrate; and
applying flash lamp light to the main surface of the semiconductor substrate to set the intensity of light applied to an outer peripheral portion of the semiconductor substrate higher than that applied to a central portion thereof by use of a plurality of flash lamps which apply pulse-like flash lamp lights of 0.1 ms to 100 ms and performing heat treatment by use of applied energy while the semiconductor substrate is being supplementally heated,
wherein the flash lamp light is applied while the intensity of light applied by an external flash lamp among the plurality of flash lamps is set higher than the intensity of light applied by an internal flash lamp.

8. The manufacturing method of the semiconductor device according to claim 7, wherein a temperature of a non-element region of the outer peripheral portion having a width corresponding to 1 to 5% of a diameter of the semiconductor substrate is set higher than that of the central portion by 1 to 10% when the flash lamp light is applied.

9. The manufacturing method of the semiconductor device according to claim 7, wherein the heat treatment performed by use of the applied energy is performed in a low-pressure state.

10. The manufacturing method of the semiconductor device according to claim 9, wherein the pressure in the low-pressure state is set in a range of 0.005 to 0.4 kgf/cm².

11. The manufacturing method of the semiconductor device according to claim 9, wherein a pressure value P in the low-pressure state satisfies a relation of $[0.01-0.005(C_S/W_S) \leq P \leq 0.4-0.2(C_S/W_S)$ (kgf/cm²)] when an area of a surface portion of the semiconductor substrate which is supplementally heated is set to $W_S$ and a contact area between the surface portion and a susceptor which makes contact with the surface portion is set to $C_S$.

12. The manufacturing method of the semiconductor device according to claim 7, wherein the flash lamp light is applied from a lamp reflector which causes reflectance of light traveling towards the outer peripheral portion to be set higher than the reflectance of light traveling towards the central portion.

13. The manufacturing method of the semiconductor device according to claim 7, wherein the supplemental heating is performed while the intensity of light applied by an external flash lamp among a plurality of halogen lamps is set higher than the intensity of light applied by an internal halogen lamp.

14. A manufacturing method of a semiconductor device comprising:
supplementally heating a semiconductor substrate having a film structure which is formed in a non-element region of an outer peripheral portion having a width corresponding to 1 to 5% of a diameter thereof on a main surface thereof and in which an absorption factor of one of pulse-like flash lamp light and laser light of 0.1 ms to 100 ms is set higher than that of a central portion by 1 to 10% from a rear surface of the main surface thereof; and
applying one of the pulse-like flash lamp light and laser light of 0.1 ms to 100 ms to the main surface of the semiconductor substrate and performing heat treatment by use of applied energy while the semiconductor substrate is being supplementally heated,
wherein the film structure includes a dummy pattern having element dimensions finer than the element dimensions of a pattern element portion of the central portion.

15. The manufacturing method of the semiconductor device according to claim 14, wherein the film structure is comprised of at least one of a carbon film, oxide film, nitride film and multi-layered insulating film.

16. The manufacturing method of the semiconductor device according to claim 14, wherein the heat treatment performed by use of the applied energy is performed in a low-pressure state.

* * * * *